(12) United States Patent
Wariishi

(10) Patent No.: US 10,759,209 B2
(45) Date of Patent: *Sep. 1, 2020

(54) LITHOGRAPHIC PRINTING PLATE PRECURSOR, METHOD OF PRODUCING SAME, AND PRINTING METHOD USING SAME

(71) Applicant: FUJIFILM Corporation, Minato-ku, Tokyo (JP)

(72) Inventor: Koji Wariishi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/399,088

(22) Filed: Apr. 30, 2019

(65) Prior Publication Data

US 2019/0255870 A1 Aug. 22, 2019

Related U.S. Application Data

(63) Continuation of application No. 15/661,175, filed on Jul. 27, 2017, now Pat. No. 10,322,597, which is a (Continued)

(30) Foreign Application Priority Data

Jan. 29, 2015 (JP) .................................. 2015-015962

(51) Int. Cl.
*B41N 1/14* (2006.01)
*G03F 7/004* (2006.01)
(Continued)

(52) U.S. Cl.
CPC .................. *B41N 1/14* (2013.01); *B41M 1/06* (2013.01); *B41N 3/00* (2013.01); *G03F 7/00* (2013.01);
(Continued)

(58) Field of Classification Search
None
See application file for complete search history.

(56) References Cited

U.S. PATENT DOCUMENTS 10,322,597 B2 * 6/2019 Wariishi .................... G03F 7/11
2006/0046198 A1 3/2006 Hunter et al.
(Continued)

FOREIGN PATENT DOCUMENTS

CN 1388009 A 1/2003
CN 101132916 A 2/2008
(Continued)

OTHER PUBLICATIONS

Communication dated Jul. 25, 2018, issued by the State Intellectual Property Office of P.R. China in counterpart Chinese Application No. 201680007922.2.

(Continued)

*Primary Examiner* — Joshua D Zimmerman
(74) *Attorney, Agent, or Firm* — Sughrue Mion, PLLC

(57) ABSTRACT

Provided are a lithographic printing plate precursor for furnishing a lithographic printing plate in which adhesion to interleaving paper is prevented, contamination inside a device is prevented, and edge stain does not occur; a method of producing the same; and a printing method using the same. The lithographic printing plate precursor includes: a support; and an image recording layer on the support, in which a region of a surface of the lithographic printing plate precursor at a side of the image recording layer, which is from an end portion of the lithographic printing plate precursor to a portion inside the end portion by 5 mm, contains at least-one polymer selected from polyamide, polyurethane, polyurea, polyester and polycarbonate, and has a content of the polymer per unit area which is greater than a content of the polymer per unit area in a region other than the above-described region by an amount of 10 mg/m² or greater.

10 Claims, 3 Drawing Sheets

Related U.S. Application Data continuation of application No. PCT/JP2016/052188, filed on Jan. 26, 2016.

(51) Int. Cl.
| | | |
|---|---|---|
| *B41M 1/06* | (2006.01) | |
| *B41N 3/00* | (2006.01) | |
| *G03F 7/00* | (2006.01) | |
| *G03F 7/11* | (2006.01) | |
| *G03F 7/09* | (2006.01) | |

(52) U.S. Cl.
CPC .............. *G03F 7/004* (2013.01); *G03F 7/092* (2013.01); *G03F 7/11* (2013.01)

(56) References Cited

U.S. PATENT DOCUMENTS

| | | |
|---|---|---|
| 2008/0199804 A1 | 8/2008 | Oohashi |
| 2009/0226841 A1 | 9/2009 | Kamitani et al. |
| 2014/0370443 A1 | 12/2014 | Hotate et al. |
| 2016/0361914 A1 | 12/2016 | Wariishi |
| 2017/0190167 A1 | 7/2017 | Ooshima et al. |

FOREIGN PATENT DOCUMENTS

| | | |
|---|---|---|
| CN | 103958214 A | 7/2014 |
| CN | 106687300 A | 5/2017 |
| EP | 2 735 444 A2 | 5/2014 |
| EP | 3 199 367 A1 | 8/2017 |
| EP | 3 202 586 A1 | 8/2017 |
| JP | 2006-243408 A | 9/2006 |
| JP | 2007-160842 A | 6/2007 |
| JP | 2008-158444 A | 7/2008 |
| JP | 2011-177983 A | 9/2011 |
| JP | 2013-116610 A | 6/2013 |
| JP | 2014-104631 A | 6/2014 |

OTHER PUBLICATIONS

Written Opinion dated Mar. 29, 2016, issued by the International Searching Authority in counterpart International Application No. PCT/JP2016/052188 (PCT/ISA/237).

International Search Report dated Mar. 29, 2016, issued by the International Searching Authority in counterpart International Application No. PCT/JP2016/052188 (PCT/ISA/210).

Communication dated Aug. 21, 2018, issued by the Japanese Patent Application No. 2018-052951.

Office Action dated Dec. 10, 2018 by the European Patent Office in counterpart European Patent Application No. 16743362.2.

Communication dated Oct. 9, 2017, issued by the European Patent Office in counterpart European Application No. 16743362.2.

Office Action dated Apr. 2, 2019, issued by the State Intellectual Property Office of P.R. China in counterpart Chinese Application No. 20168007922.2.

Office Action dated Oct. 9, 2019, issued by the State Intellectual Property Office of P.R. China in counterpart Chinese Application No. 201680007922.2.

Extended European Search Report dated Feb. 27, 2020 by the European Patent Office in counterpart European Patent Application No. 19214781.7.

* cited by examiner

LITHOGRAPHIC PRINTING PLATE PRECURSOR, METHOD OF PRODUCING SAME, AND PRINTING METHOD USING SAME

CROSS REFERENCE TO RELATED APPLICATION

This is a Continuation of U.S. application Ser. No. 15/661,175, filed Jul. 27, 2017, which is a continuation of International Application No. PCT/JP2016/052188 filed on Jan. 26, 2016, and claims priority from Japanese Patent Application No. 2015-015962 filed on Jan. 29, 2015, the entire disclosures of which are incorporated herein by reference.

BACKGROUND OF THE INVENTION

1. Field of the Invention

The present invention relates to a lithographic printing plate precursor, a method of producing the same, and a printing method using the same.

2. Description of the Related Art

Currently, in preparation of a lithographic printing plate, image exposure has been performed using a computer-to-plate (CTP) technology. That is, the image exposure is performed by directly scanning and exposing a lithographic printing plate precursor using a laser or a laser diode without using a lith film. Along with this, objects of a lithographic printing plate precursor have been changed to improvement of image-forming characteristics, printing characteristics, and physical properties corresponding to the CTP technology.

From the growing interest in the global environment, environmental problems related to a waste liquid associated with wet treatments such as a development treatment have been closed up as a problem of a lithographic printing plate precursor. Along with this, it is desired to simplify a development treatment or not to perform a development treatment. As one of a simple development treatment, a method referred to as "on-press development" has been suggested. In other words, the on-press development is a method of exposing a lithographic printing plate precursor, mounting the lithographic printing plate precursor on a printing press without performing a development treatment of the related art, and then removing an unnecessary portion of an image recording layer, at an initial stage of a typical printing step.

In a case where printing is performed using a lithographic printing plate, since the end portions of the printing plate are in positions other than paper at the time of printing on paper press, the end portions do not affect the print quality. However, in a case where printing is continuously performed on roll-like paper using a rotary press during newspaper printing or the like, since the end portions of the printing plate are on the surface of rolled paper, the ink adhering to the end portions is transferred to the paper and forms linear stain (hereinafter, also referred to as edge stain) and thus the commodity value of the printed matter is significantly impaired.

As a method of preventing edge stain on an on-press development type lithographic printing plate precursor, a method of performing a treatment on a region within 1 cm from the end portions of the on-press development type lithographic printing plate precursor for printing newspaper with a solution containing an organic solvent and a hydrophilic resin or a treatment solution containing an anionic or non-ionic surfactant has been suggested (see JP2011-177983A and JP2014-104631A).

SUMMARY OF THE INVENTION

However, according to the technologies described in JP2011-177983A and JP2014-104631A, it was found that a treated region occasionally adheres to the interleaving paper in contact with the treated region in a case where lithographic printing plate precursors treated with a treatment solution are stored in a stacked state by interposing interleaving paper therebetween even though the problem of edge stain can be solved to some extent. Therefore, a problem in that the interleaving paper is unlikely to be peeled off from the lithographic printing plate precursor in a setter during an exposing step of the lithographic printing plate precursor occurs. Further, it was found that the portion treated with the treatment solution is transferred to a conveyance path and led to contamination inside a device such as a setter or a punch bender in a series of plate production processes from the exposure to the print of lithographic printing plates.

An object of the present invention is to provide a lithographic printing plate precursor for furnishing a lithographic printing plate in which adhesion to interleaving paper is prevented, contamination inside a device is prevented, and edge stain does not occur; a method of producing the same; and a printing method using the same.

(1) A lithographic printing plate precursor comprising: a support; and an image recording layer on the support, in which a region of a surface of the lithographic printing plate precursor at a side of the image recording layer, which is from an end portion of the lithographic printing plate precursor to a portion inside the end portion by 5 mm, contains at least one polymer selected from polyamide, polyurethane, polyurea, polyester and polycarbonate, and has a content of the polymer per unit area which is greater than a content of the polymer per unit area in a region other than the above-described region by an amount of 10 mg/m$^2$ or greater.

(2) The lithographic printing plate precursor according to (1), in which the polymer includes at least one group selected from a carboxy group, a sulfo group, a phosphoric acid group, a phosphonic acid group, a sulfuric acid group, an amino group, and a polyalkylene oxide group.

(3) The lithographic printing plate precursor according to (1) or (2), in which the end portion of the lithographic printing plate precursor has a shear drop shape in which an amount X of shear drop is in a range of 35 to 150 μm and a width Y of shear drop is in a range of 70 to 300 μm.

(4) The lithographic printing plate precursor according to any one of (1) to (3), in which the image recording layer contains an infrared absorbing agent, a polymerization initiator, a polymerizable compound, and a binder polymer.

(5) The lithographic printing plate precursor according to any one of (1) to (3), in which the image recording layer contains an infrared absorbing agent, a polymerization initiator, a polymerizable compound, and a polymer compound having a fine particle shape.

(6) The lithographic printing plate precursor according to any one of (1) to (3), in which the image recording layer contains an infrared absorbing agent and a thermoplastic polymer fine particles.

(7) A method of producing a lithographic printing plate precursor which includes a support; and an image recording layer on the support, in which a region of a surface of the lithographic printing plate precursor at a side of the image recording layer, which is from an end portion of the lithographic printing plate precursor to a portion inside the end portion by 5 mm, contains at least one polymer selected from polyamide, polyurethane, polyurea, polyester and polycarbonate, and has a content of the polymer per unit area which is greater than a content of the polymer per unit area in a region other than the above-described region by an amount of 10 mg/m$^2$ or greater, the method comprising: an image recording layer forming step a of forming the image recording layer; a coating step b of coating a region of a part of the image recording layer which is formed by the step a with a coating solution containing the polymer such that the coating solution and the region overlap each other; and a cutting step c of cutting the region coated with the coating solution such that the region of a surface of the lithographic printing plate precursor at a side of the image recording layer is in a range from the end portion of the cut lithographic printing plate precursor to a portion inside the end portion by 5 mm, in which the steps are performed in order of the step a, the step b, and the step c or in order of the step b, the step a, and the step c, on the support.

(8) The method of producing a lithographic printing plate precursor according to (7), in which an undercoat layer forming step d of forming an undercoat layer is performed on the support before the step a.

(9) The method of producing a lithographic printing plate precursor according to (7) or (8), in which a protective layer forming step e of forming a protective layer is performed on the image recording layer after the step a and before the step c.

(10) A method of producing a lithographic printing plate precursor which includes a support; and an image recording layer on the support, in which a region of a surface of the lithographic printing plate precursor at a side of the image recording layer, which is from an end portion of the lithographic printing plate precursor to a portion inside the end portion by 5 mm, contains at least one polymer selected from polyamide, polyurethane, polyurea, polyester and polycarbonate, and has a content of the polymer per unit area which is greater than a content of the polymer per unit area in a region other than the above-described region by an amount of 10 mg/m$^2$ or greater, the method comprising: an image recording layer forming step a of forming the image recording layer; and a coating step f of coating a region of a surface of the lithographic printing plate precursor at a side of the image recording layer, which is from the end portion of the lithographic printing plate precursor to a portion inside the end portion by 5 mm, with a coating solution containing the polymer, in which the steps are performed in order of the step a and the step f on the support.

(11) The method of producing a lithographic printing plate precursor according to (10), in which an undercoat layer forming step d of forming an undercoat layer is performed on the support before the step a.

(12) The method of producing a lithographic printing plate precursor according to (10) or (11), in which a protective layer forming step e of forming a protective layer is performed on the image recording layer after the step a and before the step f.

(13) The method of producing a lithographic printing plate precursor according to any one of (7) to (12), in which the polymer includes at least one group selected from a carboxy group, a sulfo group, a phosphoric acid group, a phosphonic acid group, a sulfuric acid group, an amino group, and a polyalkylene oxide group.

(14) A lithographic printing plate precursor which is obtained by the production method according to any one of (7) to (13).

(15) A printing method comprising: image-exposing the lithographic printing plate precursor according to any one of (1) to (6) and (14); and supplying printing ink and dampening water to remove an unexposed portion of the image recording layer and performing printing on a printing press.

(16) The printing method according to (15), in which the printing is performed using printing paper having a width wider than the width of the lithographic printing plate precursor.

According to the present invention, it is possible to provide a lithographic printing plate precursor for furnishing a lithographic printing plate in which adhesion to interleaving paper is prevented, contamination inside a device is prevented, and edge stain does not occur; a method of producing the same; and a printing method using the same.

DESCRIPTION OF THE PREFERRED EMBODIMENTS

Figure 1:
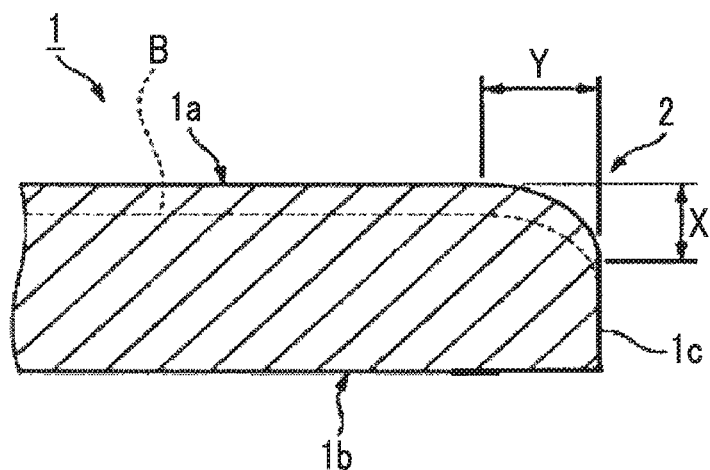
FIG. 1 is a schematic view illustrating a cross-sectional shape of an end portion of a cut lithographic printing plate precursor.

Hereinafter, the present invention will be described in detail.

A lithographic printing plate precursor of the present invention includes a support; and an image recording layer on the support, in which a region on the plate surface on the image recording layer side (a region of a surface of the lithographic printing plate precursor at a side of the image recording layer), which is from an end portion of the lithographic printing plate precursor to a portion inside the end portion by 5 mm, contains at least one polymer (hereinafter, also referred to as a specific polymer) selected from polyamide, polyurethane, polyurea, polyester and polycarbonate, and has a content of the polymer per unit area which is greater than a content of the polymer per unit area in a region other than the above-described region by an amount of 10 mg/m$^2$ or greater.

In a lithographic printing plate precursor of the related art, it is known that constituent layers thereof such as an undercoat layer (also referred to as an interlayer), an image recording layer (also referred to as an image-forming layer), and a protective layer (also referred to as an overcoat layer) contain a specific polymer. However, in all cases of these layers, the polymer is substantially uniformly present in the plane of the constituent layer of the lithographic printing plate precursor. That is, there is substantially no difference between the content of the polymer in the central portion and the content of the polymer in an end portion of the lithographic printing plate precursor.

Meanwhile, in the lithographic printing plate precursor of the present invention, the content of the specific polymer in end portion regions is intentionally set to be greater than the content of the specific polymer in regions other than the end portion regions by means of coating only the end portion regions of the lithographic printing plate precursor with a coating solution containing the specific polymer. Specifically, the content of the specific polymer per unit area in a region on the plate surface on the image recording layer side from the end portion of the lithographic printing plate precursor to a portion inside the end portion by 5 mm is greater than the content of the specific polymer per unit area in a region other than the region by an amount of 10 mg/m$^2$ or greater. When a difference between the content of the specific polymer per unit area in a region on the plate surface on the image recording layer side from the end portion of the lithographic printing plate precursor to a portion inside the end portion by 5 mm and the content of the specific polymer per unit area in a region other than the region is specified as described above, a lithographic printing plate precursor for furnishing a lithographic printing plate in which adhesion to interleaving paper is prevented, contamination inside a device is prevented, and edge stain does not occur is obtained.

The difference between contents of the specific polymer is preferably in a range of 10 to 5000 mg/m$^2$, more preferably in a range of 30 to 3000 mg/m$^2$, and particularly preferably in a range of 50 to 1000 mg/m$^2$.

Here, the end portions of the lithographic printing plate precursor indicate edge portions to be formed by a step of cutting in a sheet shape during the step of producing a lithographic printing plate precursor. A sheet-like lithographic printing plate precursor has four end portions vertically and horizontally. From the viewpoint of preventing edge stain, the number of end portions with a high content of the specific polymer according to the present invention is 1 to 4 in relation to the size of printing paper. For example, in a case of printing newspaper, two facing sides of the lithographic printing plate precursor within the plane of printing paper along the roll paper conveyance direction typically correspond to the end portions.

The region on the plate surface on the image recording layer side from the end portion to a portion inside the end portion by 5 mm includes not only the image recording layer but also all layers provided on the image recording layer side of a support. Accordingly, the content of the specific polymer per unit area in the region on the plate surface on the image recording layer side from the end portion to a portion inside the end portion by 5 mm indicates the total content of the specific polymer present on the region from the end portion on the image recording layer side of the lithographic printing plate precursor to a portion inside the end portion of the lithographic printing plate precursor by 5 mm, per unit area. Similarly, the content of the specific polymer in a region other than the region per unit area indicates the total content of the specific polymer present in the region per unit area.

Hereinafter, in the lithographic printing plate precursor of the present invention, the region on the plate surface on the image recording layer side from the end portion to a portion inside the end portion by 5 mm is also referred to as an end portion region. Further, the region on the plate surface on the image recording layer side other than the end portion region is also referred to as the other region.

The content of the specific polymer in the end portion region and the region other than the end portion region per unit area can be measured using the infrared absorption spectrum. The measurement method using the infrared absorption spectrum is not particularly limited, but a microscopic reflection method is preferable. It is preferable that the spectrum to be obtained is a Fourier transform spectrum. The measurement is performed in the following manner by assuming that the specific polymer is polyurethane.

Samples corresponding to the end portion region and the region other than the end portion region of the lithographic printing plate precursor are prepared and the Fourier transform infrared absorption spectrum (FT-IR) of the coating film of each sample on the support is measured (device: Nicolet Avater 320 FT-IR (manufactured by Thermo Fisher Scientific, measurement method: microscopic reflection method, measurement wavenumber range: approximately 4000 to 900 cm$^{-1}$, resolution: 4 cm$^{-1}$, number of times of integration: 128 times). A peak intensity difference (Xa) based on C=O stretching vibration derived from a urethane bond is acquired from a difference in spectrum between the two samples. Separately, samples obtained by changing the coating amounts of polyurethane into 10, 100, and 1000 mg/m$^2$ are prepared, and the peak intensity (X) (peak based on C=O stretching vibration derived from a urethane bond: 1740 to 1690 cm$^{-1}$) in each coating amount is measured in the same manner. The calibration curve of the coating amount (mg/m$^2$) with respect to the peak intensity (X) is created and an inclination (A) thereof is acquired. A difference in content of polyurethane between the end portion region and the region other than the end portion region per unit area is calculated according to the following equation using the peak intensity difference (Xa) and the inclination of the calibration curve (A).

Difference in content of polyurethane per unit area (mg/m$^2$)=(A)×(Xa)

In a specific polymer other than polyurethane, a difference in content of the specific polymer can be acquired, in the same manner as described above, by measuring the specific peak intensity derived from a bond in each of the following polymers.

Polyamide: 1680 to 1630 cm$^{-1}$ (C=O stretching vibration)

Polyurea: 1640 to 1610 cm$^{-1}$ (C=O stretching vibration)

Polyester: 1750 to 1720 cm$^{-1}$ (C=O stretching vibration), 1210 to 1120 cm$^{-1}$ (C=O stretching vibration)

Polycarbonate: 1780 to 1750 cm$^{-1}$ (C=O stretching vibration)

[Specific Polymer]

The polyamide, polyurethane, polyurea, polyester, and polycarbonate which are specific polymers contained in the end portion region of the lithographic printing plate precursor according to the present invention will be described below.

[Polyamide]

The polyamide includes polymers having an amide bond (—NRC(=O)— (here, R represents a hydrogen atom or a substituent)) in the main chain or the graft chain and derivatives thereof. It is preferable that the main chain has an amide bond.

The polyamide is basically synthesized through a co-condensation polymerization reaction between a diamine compound and a dicarboxylic acid compound (alternatively, a dicarboxylic acid chloride), a polycondensation reaction of amino acid, or ring-opening polymerization of a lactam. For example, the polyamide can be synthesized using the method described in Experimental Chemistry Course, 4th edition, Vol. 28, polymer synthesis, pp. 252 and methods in conformity with this method.

Examples of the diamine compound include p-phenylenediamine, m-phenylenediamine, 2,5-diaminotoluene, 2,5-diaminophenol, 3,5-diaminobenzyl alcohol, 4,4'-diaminobiphenyl, 4,4'-diaminodiphenylmethane, 4,4'-diaminodiphenylether, 4,4'-sulfonyl dianiline, 4,4'-diaminodiphenylamine, 4,4'-diaminobenzophenone, 1,4-diaminonaphthalene, 1,2-bis(4-aminophenyl)ethane, 1,4-bis(4-aminophenyl)butane, 1,3-bis(4-aminophenyl)benzene, 1,4-bis(4-aminobenzyl)benzene, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane.

Examples of the dicarboxylic acid compound include oxalic acid, malonic acid, succinic acid, glutaric acid, adipic acid, pimelic acid, suberic acid, azelaic acid, sebacic acid, 1,10-decanedicarboxylic acid, 1,11-undecanedicarboxylic acid, 1,12-dodecanedicarboxylic acid, terephthalic acid, isophthalic acid, 2,6-naphthalenedicarboxylic acid, fumaric acid, maleic acid, 1,3-benenediacetic acid, and 1,4-benenediacetic acid.

Examples of the amino acid include ε-aminocaproic acid, glutamic acid, aspartic acid, lysine, arginine, histidine, glycine, alanine, leucine, serine, cysteine, glutamine, asparagine, phenylalanine, and tyrosine.

Examples of the lactam include ε-caprolactam, undecane lactam, and lauryl lactam.

Preferred examples of the polyamide include a polyamide having a sulfo group or a sulfonyl group in the side chain thereof described in JP1973-72250A (JP-S48-72250A), a polyamide having an ether bond or a polyether bond in the main chain or in the side chain thereof described in JP1974-43465A (JP-S49-43465A) or JP1980-74537A (JP-S-55-74537A), and a polyamide having an amino group in the main chain or in the side chain thereof described in JP1975-7605A (JP-S-50-7605A). Further, commercially available products such as AQ NYLON (manufactured by Toray Co., Ltd.) can be used.

Derivatives of the polyamide include compounds in which atoms in a polyamide molecule are substituted or the structure of an amide bond is changed due to an addition reaction, for example, a compound obtained by substituting a hydrogen atom of an amide bond with a methoxymethyl group using a polyamide as a raw material.

[Polyurethane]

The polyurethane includes polymers having a urethane bond (—NRC(=O)O— (here, R represents a hydrogen atom or a substituent)) in the main chain or the graft chain and derivatives thereof. It is preferable that the main chain has a urethane bond.

The polyurethane is basically synthesized through a condensation reaction between a diisocyanate compound and a diol compound.

Examples of the diisocyanate compound include an alicyclic diisocyanate compound such as hexamethylene diisocyanate, 2,2,4-trimethylhexamethylene diisocyanate, hydrogenated xylylene diisocyanate, 1,4-cyclohexane diisocyanate, or 4,4-dicyclohexylmethane diisocyanate; an araliphatic diisocyanate compound such as xylylene diisocyanate or tetramethylxylylene diisocyanate; an aromatic diisocyanate compound such as toluylene diisocyanate or phenylmethane diisocyanate; and modified products of these diisocyanates (such as a carbodiimide-containing modified product, a uretdione-containing modified product, and a uretoimine-containing modified product).

Examples of the diol compound include a diol compound obtained by (co)polymerizing alkylene oxide such as ethylene oxide or propylene oxide or heterocyclic ether such as tetrahydrofuran. Specific examples of the diol compound include polyether diol such as polyethylene glycol, polypropylene glycol, polytetramethylene ether glycol, or polyhexamethylene ether glycol; polyester diol such as polyethylene adipate, polybutylene adipate, polyneopentyl adipate, poly-3-methylpentyl adipate, polyethylene/butylene adipate, or polyneopentyl/hexyl adipate; polylactone diol such as polycaprolactone diol; and polycarbonate diol. Among these, polyether-based compounds, polyester-based compounds, and polycarbonate-based compounds are preferable. Further, a diol compound having an acid group such as a carboxylic acid group or a sulfo group can be also used, and specific examples thereof include dimethylol acetic acid, dimethylol propionic acid, and dimethylol butyric acid.

Preferred examples of polyurethane include polyether-based polyurethane, polyester-based polyurethane, and polycarbonate-based polyurethane respectively obtained by using polyether-based diol, polyester-based diol, and polycarbonate-based diol as a diol compound.

Particularly, a urethane resin to which an acidic group is introduced using a diol having an acidic group such as a carboxy group or a sulfo group is desirable.

Polyurethane obtained by neutralizing an acidic group can be used. Examples of a base used for neutralization include alkylamine such as butylamine or trimethylamine; alkanolamine such as monoethanolamine, diethanolamine, or triethanolamine; cyclic amine such as morpholine; ammonia; and an inorganic salt such as sodium hydroxide.

[Polyurea]

The polyurea includes polymers having a urea bond (—NRC(=O)NR— (here, R represents a hydrogen atom or a substituent)) in the main chain or the graft chain and derivatives thereof. It is preferable that the main chain has a urea bond.

The polyurea is basically synthesized through a polyaddition reaction between a diamine compound and a diisocyanate compound or a deammoniation reaction between a diamine compound and urea.

Examples of the diamine compound include ethylenediamine, 1,3-propanediamine, 1,2-propanediamine, hexamethylenediamine, octamethylenediamine, o-phenylenediamine, m-phenylenediamine, p-phenylenediamine, piperazine, 2,5-dimethylpiperazine, 4,4'-diaminodiphenyl ether, 3,3'-diaminodiphenyl sulfone, and xylylenediamine.

Examples of the diisocyanate compound include the diisocyanate compounds exemplified in the section of the polyurethane above.

[Polyester]

The polyester includes polymers having an ester bond (—C(=O)O—) in the main chain or the graft chain and derivatives thereof. It is preferable that the main chain has an ester bond.

The polyester is basically synthesized through dehydration condensation between a diol compound and a dicarboxylic acid compound.

Examples of the dicarboxylic acid compound include oxalic acid, malonic acid, succinic acid, glutaric acid, dimethyl malonic acid, adipic acid, pimelic acid, α,α-dimethylsuccinic acid, acetonedicarboxylic acid, sebacic acid, 1,9-nonanedicarboxylic acid, fumaric acid, maleic acid, itaconic acid, citraconic acid, phthalic acid, isophthalic acid, terephthalic acid, 2-butylterephthalic acid, tetrachloroterephthalic acid, acetylenedicarboylic acid, poly(ethyleneterephthalate)dicarboxylic acid, 1,2-cyclohexanedicarboxylic acid, 1,4-cyclohexanedicarboylic acid, ω-poly(ethyleneoxide)dicarboxylic acid, and p-xylylenedicarboxylic acid.

When a polycondensation reaction is performed between a dicarboxylic acid compound and a diol compound, the dicarboxylic acid compound can be used in the form of an alkyl ester (such as dimethyl ester) of dicarboxylic acid or an acid chloride of dicarboxylic acid or in the form of an acid anhydride such as maleic anhydride, succinic anhydride, or phthalic anhydride.

A dicarboxylic acid compound having an ionic group, for example, an anionic group such as a sulfo group, a sulfuric monoester group, —OPO(OH)$_2$, a sulfinic acid group, or salts of these (for example, alkali metal salts such as Na and K or ammonium salts such as ammonia, dimethylamine, ethanolamine, diethanolamine, triethanolamine, and trimethylamine) in addition to a carboxy group or a cationic group such as a primary amine, a secondary amine, a tertiary amine, or a quaternary ammonium salt can be used as the dicarboxylic acid compound. As the ionic group, an anionic group is preferable and a sulfo group is particularly preferable.

Preferred examples of the dicarboxylic acid having a sulfo group include sulfophthalic acid (such as 3-sulfophthalic acid, 4-sulfophthalic acid, 4-sulfoisophthalic acid, 5-sulfoisophthalic acid, or 2-sulfoterephthalic acid), sulfosuccinic acid, sulfonaphthalenedicarboxylic acid (such as 4-sulfo-1,8-naphthalenedicarboxylic acid or 7-sulfo-1,5-naphthalenedicarboxylic acid), 3,5-di(2-hydroxy)ethyloxycarbonylbenzenesulfonic acid, and salts of these.

Examples of the diol compound include the diol compounds exemplified in the section of polyurethane above.

Water-soluble polyester can be preferably used as the polyester. Examples of commercially available products include NICHIGO POLYESTER series (manufactured by Nippon Synthetic Chemical Industry Co., Ltd.) and Plus Coat series (manufactured by GOO CHEMICAL CO., LTD.).

[Polycarbonate]

The polycarbonate includes polymers having a carbonate bond (—OCOO—) in the main chain or the graft chain and derivatives thereof. It is preferable that the main chain has a carbonate bond.

The polycarbonate is basically synthesized through a reaction between a diol compound and phosgene or a carbonic acid ester derivative (for example, aromatic ester such as diphenyl carbonate).

Examples of the diol compound include the diol compounds exemplified in the section of polyurethane.

The raw materials such as a diamine compound and a dicarboxylic acid compound used for synthesis of the specific polymers may be used alone or two or more kinds thereof may be mixed at an arbitrary ratio and then used depending on the various purposes thereof (for example, adjustment of the glass transition temperature (Tg) of a specific polymer, solubility, coating properties of a treatment solution, or stability).

It is preferable that the specific polymer of the present invention includes at least one group (hereinafter, also referred to as a specific functional group) selected from a carboxy group, a sulfo group, a phosphoric acid group, a phosphonic acid group, a sulfuric acid group, an amino group, and a polyalkylene oxide group.

Among the examples of the specific functional groups, some or all of the acidic groups (a carboxy group, a sulfo group, a phosphoric acid group, a phosphonic acid group, and a sulfuric acid group) and alkali metals (Li, Na, K, and the like) or alkaline earth metals (Mg, Ca, and the like) may form salts.

An amino group may form an ammonium group. The ammonium group includes a group formed by drawing out one hydrogen atom from primary to quaternary ammoniums in which H in $NH_4^+$ is substituted with an alkyl group, an aryl group, or an aralkyl group. Among these, a group formed by drawing one hydrogen atom from the quaternary ammonium is preferable. The ammonium group may be chain-like or cyclic.

As the alkyl group, a linear, branched, or cyclic alkyl group having 1 to 12 carbon atoms is preferable. Specific examples of the alkyl group include, a methyl group, an ethyl group, a propyl group, a butyl group, a pentyl group, a hexyl group, a heptyl group, an octyl group, a nonyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

As the aryl group, an aryl group having 6 to 20 carbon atoms is preferable. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, a N-phenylcarbamoylphenyl group, a cyanophenyl group, a sulfophenyl group, a sulfonatophenyl group, a phosphonophenyl group, and a phosphonatophenyl group.

As the aralkyl group, an aralkyl group having 7 to 12 carbon atoms is preferable. Specific examples of the aralkyl group include a benzyl group, a phenethyl group, and a naphthylmethyl group.

As the polyalkylene oxide group, a polyalkylene oxide group having 2 to 120 alkylene oxide units, each of which has 2 or 3 carbon atoms, is preferable. A polyethylene oxide group having 2 to 120 ethylene oxide units is more preferable and a polyethylene oxide group having 10 to 100 ethylene oxide units is particularly preferable.

Among the specific functional groups, a carboxy group, a sulfo group, a phosphoric acid group, and a phosphonic acid group are preferable and a sulfo group, a phosphoric acid group, and a phosphonic acid group are more preferable.

A specific functional group can be introduced to each of the above-described polymers using various methods. For example, a specific functional group may be introduced by producing each polymer using a raw material compound having the specific functional group or the specific functional group may be introduced by carrying out a polymer reaction after the polymer is produced. For example, in a case where the specific polymer is polyurethane, a specific functional group can be introduced as a substituent in the main chain of the polymer using a diol containing an acidic group which is the specific functional group at the time when the polyurethane is produced. Further, in a case where the specific polymer is polyester, a carboxy group can be introduced by being allowed to remain as an unreacted terminal of dicarboxylic acid in the terminal of polyester. In addition, an acidic group can be introduced by reacting an acid anhydride (for example, maleic anhydride) with a reactive group such as a —OH group or an amino group present in the terminal after each polymer is produced.

When the specific polymers of the present invention have the above-described specific functional groups, there is an advantage that the solubility in a solvent used at the time of application is improved. Therefore, the specific polymers having the above-described specific functional groups can be desirably dissolved in a solvent used for a coating solution, such as water, a water-miscible organic solvent, or a mixture of these.

Examples of the water-miscible organic solvent include alcohols (such as methanol, ethanol, propanol, isopropanol, benzyl alcohol, ethylene glycol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, and tetraethylene glycol); ketones (such as acetone and methyl ethyl ketone); esters (such as methyl lactate, butyl lactate, propylene glycol monomethyl ether acetate, and diethylene glycol acetate); amides (such as dimethylformamide); and sulfoxide (such as dimethyl sulfoxide).

Further, the specific polymers having the above-described specific functional groups are preferable from the viewpoints of exhibiting excellent solubility in water or a solution including water as a main component, which is used at the time of development of the lithographic printing plate precursor, such as an alkaline aqueous solution, an acidic aqueous solution, an aqueous solution containing a surfactant, or an aqueous solution containing an organic solvent.

Therefore, the specific polymers having the specific functional groups are also advantageous in that the specific polymers further contribute promotion of on-press development and suppression of edge stain due to hydrophilization of a support.

From the above-described viewpoint, the solubility of the specific polymer of the present invention in water at 20° C. is preferably 10 g/L or greater, more preferably 30 g/L or greater, and still more preferably 50 g/L or greater.

The main chain of the specific polymer according to the present invention may contain two or more kinds of bonds included in the main chain of the specific polymer, that are, an amide bond, a urethane bond, a urea bond, an ester bond, and a carbonate bond. Examples thereof include polyurethane polyurea having a urethane bond and a urea bond and polycarbonate-based polyurethane having a carbonate bond and a urethane bond. In a case where the specific polymer of the present invention is a polymer having two or more kinds of bonds, this specific polymer is classified into a polymer of the bond with the highest content. For example, in a polymer having a urethane bond and a urea bond, the polymer is classified into polyurethane in a case where the content of the urethane bond is greater than the content of the urea bond.

The weight average molecular weight (Mw) of the specific polymer according to the present invention is preferably in a range of 2000 to 1000000, more preferably in a range of 5000 to 500000, and still more preferably in a range of 10000 to 200000. In the present specification, unless otherwise specified, the weight average molecular weight of the specific polymers and other polymer compounds is a value in terms of standard polystyrene obtained by performing measurement using gel permeation chromatography (GPC). The measurement using gel permeation chromatography (GPC) is performed under the following conditions.

Concentration of sample: 0.2% by mass
Column: TSKgel α-M+TSKgel α-2500 (manufactured by Tosho Corporation)
Eluant: 100 mM $NaNO_3$ aqueous solution
Flow rate: 0.35 ml/min
Detector: differential refractive index (RI) detector
Temperature: 40° C.

The form of the specific polymer according to the present invention is not particularly limited. Examples thereof typically include an emulsion type such as a self-emulsifying emulsion or a self-stabilizing type in addition to a solid type (such as powdery, granular, or paste-like).

Any position from the top of a support and the top of a top layer constituting the lithographic printing plate precursor may contain the specific polymer according to the present invention. For example, in a case where the lithographic printing plate precursor has an undercoat layer, an image recording layer, and a protective layer in this order on the support, the specific polymer may be present in any position of between the support and the undercoat layer, in the undercoat layer, between the undercoat layer and the image recording layer, in the image recording layer, between the image recording layer and the protective layer, in the protective layer, and on the protective layer. Further, the specific polymer may be present in plural positions. In the case of the lithographic printing plate precursor having the above-described configuration, the specific polymer may be present between the support and the undercoat layer and in the undercoat layer, between the support and the undercoat layer and in the undercoat layer and between the undercoat layer and the image recording layer, and in the protective layer and on the protective layer. In order to prevent the image recording layer from remaining on the support which is assumed to cause edge stain, it is preferable that the specific polymer of the present invention is present between the support and the image recording layer. Specifically, it is preferable that the specific polymer is present between the support and the undercoat layer, in the undercoat layer, between the undercoat layer and the image recording layer, between the support and the undercoat layer and in the undercoat layer, between the support and the undercoat layer and in the undercoat layer, and between the undercoat layer and the image recording layer. The specific polymer may be allowed to be present in a specific position of the lithographic printing plate precursor by applying a coating solution containing the specific polymer to the specific position of the lithographic printing plate precursor. A specific method thereof will be described below as the method of producing a lithographic printing plate precursor.

It is preferable that the region on the plate surface on the image recording layer side from the end portion according to the present invention to a portion inside the end portion by 5 mm further contains a hydrophilic compound in addition to the specific polymer. A hydrophilic compound has an effect of preventing stain from being generated due to printing ink being accumulated in cracks which may be generated at the time when a shear drop shape described below is formed, by means of hydrophilizing the cracks.

A water-soluble compound is preferable as the hydrophilic compound. For example, as the hydrophilic compound, a compound dissolved in 100 g of water at 20° C. by an amount of 0.5 g or greater is preferable and a compound dissolved in 100 g of water at 20° C. by an amount of 2 g or greater is more preferable.

It is preferable that the hydrophilic compound includes a hydrophilizable compound in addition to the specific polymer. The support-adsorptive group is an adsorptive group which can be adsorbed to the surface of the support of the lithographic printing plate precursor. Preferred examples thereof include a phenolic hydroxy group, a carboxy group, a —PO$_3$H$_2$ group, a —OPO$_3$H$_2$ group, a —CONHSO$_2$— group, a —SO$_2$NHSO$_2$— group, and a —COCH$_2$COCH$_3$ group. Among these, a —PO$_3$H$_2$ group and a —OPO$_3$H$_2$ group are preferable. Hereinafter, a phosphoric acid compound and a phosphonic acid compound which include a —PO$_3$H$_2$ group and a —OPO$_3$H$_2$ group will be described in detail.

(Phosphoric Acid Compound)

A phosphoric acid compound includes phosphoric acid, a salt thereof, and an ester thereof. Examples of the phosphoric acid compound include phosphoric acid, metaphosphoric acid, monoammonium phosphate, ammonium secondary phosphate, sodium dihydrogen phosphate, sodium monohydrogen phosphate, potassium primary phosphate, potassium secondary phosphate, sodium tripolyphosphate, potassium pyrophosphate, and sodium hexametaphosphate. Among these, sodium dihydrogen phosphate, sodium monohydrogen phosphate, or sodium hexametaphosphate are preferably used.

As the phosphoric acid compound, a polymer compound is preferable and a polymer compound having a phosphoric acid monoester group is more preferable. A specific polymer-containing coating solution having excellent coating properties is obtained.

Examples of the polymer compound having a phosphoric acid ester group include a polymer formed of one or more kinds of monomers having a phosphoric acid ester group in a molecule, a copolymer of one or more kinds of monomers having a phosphoric acid ester group and one or more kinds of monomers that do not have a phosphoric acid ester group, and a polymer obtained by introducing a phosphoric acid ester group into a polymer that does not have a phosphoric acid ester group through a polymer reaction.

Examples of the monomer having a phosphoric acid ester group include mono(2-methacryloyloxyethyl) acid phosphate, mono(2-methacryloyloxypolyoxyethyleneglycol) acid phosphate, mono(2-acryloyloxyethyl) acid phosphate, 3-chloro-2-acid phosphooxypropyl methacrylate, acid phosphooxy polyoxyethylene glycol monomethacrylate, acid phosphooxy polyoxypropylene glycol methacrylate, (meth)acryloyloxy ethyl acid phosphate, (meth)acryloyloxy propyl acid phosphate, (meth)acryloyloxy-2-hydroxy propyl acid phosphate, (meth)acryloyloxy-3-hydroxy propyl acid phosphate, (meth)acryloyloxy-3-chloro-2-hydroxy propyl acid phosphate, and allyl alcohol acid phosphate. Among these examples of monomers, from the viewpoint of preventing edge stain, mono(2-acryloyloxyethyl) acid phosphate is preferably used. Typical examples of commercially available products include LIGHT ESTER P-1M (manufactured by Kyoei Kagaku Kogyo Co., Ltd.) and PHOSMER PE (manufactured by Uni-Chemical Co., Ltd.).

As a monomer which does not have a phosphoric acid ester group in the copolymer, a monomer having a hydrophilic group is preferable. Examples of the hydrophilic group include a hydroxy group, an alkylene oxide structure, an amino group, an ammonium group, and an amide group. Among these, a hydroxy group, an alkylene oxide structure, or an amide group is preferable, an alkylene oxide structure which has 1 to 20 alkylene oxide units having 2 or 3 carbon atoms is more preferable, and a polyethylene oxide structure having 2 to 10 ethylene oxide units is still more preferable.

Examples thereof include 2-hydroxy ethyl acrylate, ethoxy diethylene glycol acrylate, methoxy triethylene glycol acrylate, poly(oxyethylene) methacrylate, N-isopropylacrylamide, and acrylamide.

The proportion of the repeating unit having a phosphoric acid ester group in the polymer compound having a phosphoric acid ester group is preferably in a range of 1% to 100% by mole, more preferably in a range of 5% to 100% by mole, and still more preferably in a range of 10% to 100% by mole.

The weight-average molecular weight of the polymer compound having a phosphoric acid ester group is preferably in a range of 5,000 to 1,000,000, more preferably in a range of 7,000 to 700,000, and particularly preferably in a range of 10,000 to 500,000.

(Phosphonic Acid Compound)

A phosphonic acid compound includes phosphonic acid, a salt thereof, and an ester thereof. Examples of the phosphonic acid compound include ethyl phosphonic acid, propyl phosphonic acid, isopropyl phosphonic acid, butyl phosphonic acid, hexyl phosphonic acid, octyl phosphonic acid, dodecyl phosphonic acid, octadecyl phosphonic acid, 2-hydroxyethyl phosphonic acid and sodium salts or potassium salts of these, alkyl phosphonic acid monoalkyl ester such as methyl phosphonic acid methyl ester, ethyl phosphonic acid methyl ester, or 2-hydroxyethyl phosphonic acid methyl ester and sodium salts or potassium salts of these, alkylene diphosphonic acid such as methylene diphosphonic acid or ethylene diphosphonic acid and sodium salts or potassium salts of these, and polyvinyl phosphonic acid.

As the phosphonic acid compound, a polymer compound is preferable. A specific polymer-containing coating solution having excellent coating properties is obtained.

Preferred examples of the polymer compound as a phosphonic acid compound include polyvinyl phosphonic acid, a polymer formed of one or more monomers having a phosphonic acid group or a phosphonic acid monoester group in a molecule, and a copolymer of one or more kinds of monomers having a phosphonic acid group or a phosphonic acid monoester group and one or more kinds of monomers which do not have a phosphonic acid group and a phosphonic acid monoester group.

Examples of the monomer having a phosphonic acid group include vinylphosphonic acid, ethyl phosphonic acid monovinyl ester, acryloyl aminomethyl phosphonic acid, and 3-methacryloyloxy propyl phosphonic acid.

As the polymer compound, both of a homopolymer and a copolymer of monomers having a phosphonic acid ester group are also used. As the copolymer, for example, a copolymer of a monomer having a phosphonic acid ester group and a monomer having a hydrophilic group or a copolymer of a monomer having a phosphonic acid ester group and a monomer which does not have both of a phosphonic acid ester group and a hydrophilic group can be used.

In the monomers having a hydrophilic group in the copolymers, examples of the hydrophilic group include a hydroxy group, an alkylene oxide structure, an amino group, an ammonium group, and an amide group. Among these, a hydroxy group, an alkylene oxide structure, or an amide group is preferable, an alkylene oxide structure which has 1 to 20 alkylene oxide units having 2 or 3 carbon atoms is more preferable, and a polyethylene oxide structure having 2 to 10 ethylene oxide units is still more preferable. Examples thereof include 2-hydroxy ethyl acrylate, ethoxy diethylene glycol acrylate, methoxy triethylene glycol acrylate, poly(oxyethylene) methacrylate, N-isopropylacrylamide, and acrylamide.

The proportion of the repeating unit having a phosphonic acid ester group in the polymer compound having a phosphonic acid ester group is preferably in a range of 1% to 100% by mole, more preferably in a range of 3% to 100% by mole, and still more preferably in a range of 5% to 100% by mole.

The weight-average molecular weight of the polymer compound having a phosphonic acid ester group is preferably in a range of 5,000 to 1,000,000, more preferably in a range of 7,000 to 700,000, and particularly preferably in a range of 10,000 to 500,000.

From the viewpoint of workability, it is preferable that the above-described hydrophilic compound is allowed to be contained in the region on the plate surface on the image recording layer side from the end portion of the lithographic printing plate precursor to a portion inside the end portion by 5 mm at the same time when the specific polymer is applied to the lithographic printing plate precursor. Specifically, both of the steps can be easily performed by adding a hydrophilic compound to a coating solution that contains the specific polymer and coating the lithographic printing plate precursor with the coating solution.

[Lithographic Printing Plate Precursor]

The lithographic printing plate precursor of the present invention has an image recording layer on the support. The lithographic printing plate precursor may have an undercoat layer between the support and the image recording layer and a protective layer on the image recording layer as necessary.

[Image Recording Layer]

The image recording layer of the lithographic printing plate precursor is an image recording layer in which the non-image portion is removed by at least one of acidic to alkaline dampening water or printing ink on a printing press.

According to one aspect of the present invention, the image recording layer is an image recording layer (hereinafter, also referred to as an image recording layer A) that contains an infrared absorbing agent, a polymerization initiator, a polymerizable compound, and a binder polymer.

According to another aspect of the present invention, the image recording layer is an image recording layer (hereinafter, also referred to as an image recording layer B) that contains an infrared absorbing agent, a polymerization initiator, a polymerizable compound, and a particulate polymer compound.

According to still another aspect of the present invention, the image recording layer is an image recording layer (hereinafter, also referred to as an image recording layer C) that contains an infrared absorbing agent and thermoplastic polymer fine particles.

(Image Recording Layer A)

The image recording layer A contains an infrared absorbing agent, a polymerization initiator, a polymerizable compound, and a binder polymer. Hereinafter, the constituent components of the image recording layer A will be described.

<Infrared Absorbing Agent>

An infrared absorbing agent has a function of converting absorbed infrared rays into heat, a function of electron transfer to a polymerization initiator described below through excitation by infrared rays, and/or a function of energy transfer. As the infrared absorbing agent used in the present invention, a dye or a pigment having maximum absorption at a wavelength of 760 to 1,200 nm is preferable and a dye having maximum absorption at a wavelength of 760 to 1,200 nm is more preferable.

As the dye, dyes described in paragraphs [0082] to [0088] of JP2014-104631A can be used and the contents of which are incorporated in the specification of the present application.

The particle diameter of the pigment is preferably in a range of 0.01 to 1 μm and more preferably in a range of 0.01 to 0.5 μm. A known dispersion technique used to produce inks or toners can be used for dispersion of the pigment. The details are described in "Latest Pigment Application Technology" (CMC Publishing Co., Ltd., 1986) and the like.

The infrared absorbing agent may be used alone or in combination of two or more kinds thereof.

The content of the infrared absorbing agent is preferably in a range of 0.05 to 30 parts by mass, more preferably in a range of 0.1 to 20, and particularly preferably in a range of 0.2 to 10 parts by mass with respect to 100 parts by mass of the total solid content of the image recording layer.

<Polymerization Initiator>

The polymerization initiator indicates a compound that initiates and promotes polymerization of a polymerizable compound. As the polymerization initiator, a known thermal polymerization initiator, a compound having a bond with small bond dissociation energy, or a photopolymerization initiator can be used. Specifically, radical polymerization initiators described in paragraphs [0092] to [0106] of JP2014-104631A can be used and the contents of which are incorporated in the specification of the present application.

Preferred examples of compounds in the polymerization initiators include onium salts such as iodonium salts and sulfonium salts. Specific preferred examples of the compounds in each of the salts are the compounds described in paragraphs [0104] to [0106] of JP2014-104631A and the contents of which are incorporated in the specification of the present application.

The content of the polymerization initiator is preferably in a range of 0.1% to 50% by mass, more preferably in a range of 0.5% to 30% by mass, and particularly preferably in a range of 0.8% to 20% by mass with respect to the total solid content of the image recording layer. When the content thereof is in the above-described range, improved sensitivity and improved stain resistance of a non-image portion at the time of printing are obtained.

<Polymerizable Compound>

A polymerizable compound is an addition polymerizable compound having at least one ethylenically unsaturated double bond and is selected from compounds having at least one and preferably two or more terminal ethylenically unsaturated bonds. These have chemical forms such as a monomer, a pre-polymer, that is, a dimer, a trimer, an oligomer, and a mixture of these. Specifically, polymerizable compounds described in paragraphs [0109] to [0113] of JP2014-104631A can be used and the contents of which are incorporated in the specification of the present application.

Among the examples described above, from the viewpoint that the balance between hydrophilicity associated with on-press developability and polymerization ability associated with printing durability is excellent, isocyanuric acid ethylene oxide-modified acrylates such as tris(acryloyloxyethyl) isocyanurate and bis(acryloyloxyethyl)hydroxyethyl isocyanurate are particularly preferable.

The details of the structures of these polymerizable compounds, whether to be used alone or in combination, and the usage method such as the addition amount can be arbitrarily set according to the final performance design of a lithographic printing plate precursor. The content of the above-described polymerizable compound to be used is preferably in a range of 5% to 75% by mass, more preferably in a range of 10% to 70% by mass, and particularly preferably in a range of 15% to 60% by mass with respect to the total solid content of the image recording layer.

<Binder Polymer>

A binder polymer can be mainly used to improve the film hardness of the image recording layer. As the binder polymer, known polymers of the related art can be used and polymers having coated-film properties are preferable. Among examples thereof, an acrylic resin, a polyvinyl acetal resin, and a polyurethane resin are preferable.

Preferred examples of the binder polymers include polymers having a cross-linking functional group in the main or side chain, preferably in the side chain, for improving coated-film strength of an image portion as described in JP2008-195018A. Cross-linking occurs between polymer molecules by a cross-linking group so that curing is promoted.

Preferred examples of the cross-linking functional group include an ethylenically unsaturated group such as a (meth) acryl group, a vinyl group, an allyl group, or a styryl group and an epoxy group, and the cross-linking functional groups can be introduced into a polymer by a polymer reaction or copolymerization. For example, a reaction between an acrylic polymer having a carboxy group in the side chain thereof or polyurethane and glycidyl methacrylate or a reaction between a polymer having an epoxy group and ethylenically unsaturated group-containing carboxylic acid such as methacrylic acid can be used.

The content of the cross-linking group in the binder polymer is preferably in a range of 0.1 to 10.0 mmol, more preferably in a range of 0.25 to 7.0 mmol, and particularly preferably in a range of 0.5 to 5.5 mmol with respect to 1 g of the binder polymer.

Moreover, it is preferable that the binder polymer includes a hydrophilic group. The hydrophilic group contributes to providing on-press developability for the image recording layer. Particularly, in the coexistence of a cross-linking group and a hydrophilic group, both of printing durability and on-press developability can be achieved.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to provide a hydrophilic group for a binder polymer.

In addition, in order to control the impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The weight-average molecular weight (Mw) of the binder polymer is preferably 2,000 or greater, more preferably 5,000 or greater, and still more preferably in a range of 10,000 to 300,000.

The content of the binder polymer is practically in a range of 3% to 90% by mass, preferably in a range of 5% to 80% by mass, and more preferably in a range of 10% to 70% by mass with respect to the total solid content of the image recording layer.

As a preferred example of the binder polymer, a polymer compound having a polyoxyalkylene chain in the side chain is exemplified. When the image recording layer contains a polymer compound having a polyoxyalkylene chain in the side chain (hereinafter, also referred to as a POA chain-containing polymer compound), permeability of dampening water is promoted and on-press developability is improved.

Examples of the resin constituting the main chain of the POA chain-containing polymer compound include an acrylic resin, a polyvinyl acetal resin, a polyurethane resin, a polyurea resin, a polyimide resin, a polyamide resin, an epoxy resin, a methacrylic resin, a polystyrene resin, a novolac type phenolic resin, a polyester resin, synthetic rubber, and natural rubber. Among these, an acrylic resin is particularly preferable.

The POA chain-containing polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, alkylene oxide having 2 to 6 carbon atoms is preferable, ethylene oxide (oxyethylene) or propyleneoxide (oxypropylene) is more preferable, and ethylene oxide is still more preferable.

The repetition number of the alkylene oxide in a polyoxyalkylene chain, that is, a poly(alkyleneoxide) moiety is preferably in a range of 2 to 50 and more preferably in a range of 4 to 25.

When the repetition number of the alkylene oxide is 2 or greater, the permeability of dampening water is sufficiently improved. Further, from the viewpoint that printing durability is not degraded due to abrasion, it is preferable that the repetition number thereof is 50 or less.

As the poly(alkyleneoxide) moiety, structures described in paragraphs [0060] to [0062] of JP2014-104631A are preferable and the contents of which are incorporated in the specification of the present application.

The POA chain-containing polymer compound may have cross-linking properties in order to improve coated-film strength of an image portion. Examples of the POA chain-containing polymer compounds having cross-linking properties are described in paragraphs [0063] to [0072] of JP2014-104631A and the contents of which are incorporated in the specification of the present application.

The proportion of repeating units having a poly(alkyleneoxide) moiety in the total repeating units constituting the POA chain-containing polymer compound is not particularly limited, but is preferably in a range of 0.5% to 80% by mole and more preferably in a range of 0.5% to 50% by mole. Examples of the POA chain-containing polymer compounds are described in paragraphs [0075] and [0076] of JP2014-104631A and the contents of which are incorporated in the specification of the present application.

As the POA chain-containing polymer compound, hydrophilic macromolecular compounds such as polyacrylic acid and polyvinyl alcohol described in JP2008-195018A can be used in combination as necessary. Further, a lipophilic polymer compound and a hydrophilic macromolecular compound can be used in combination.

In addition to the presence of the POA chain-containing polymer compound in the image recording layer as a binder that plays a role of connecting image recording layer components with each other, the specific polymer compound may be present in the form of fine particles. In a case where the specific polymer compound is present in the form of fine particles, the average particle diameter is in a range of 10 to 1,000 nm, preferably in a range of 20 to 300 nm, and particularly preferably in a range of 30 to 120 nm.

The content of the POA chain-containing polymer compound is preferably in a range of 3% to 90% by mass and more preferably in a range of 5% to 80% by mass with respect to the total solid content of the image recording layer. When the content thereof is in the range of 3% to 90% by mass, both of permeability of dampening water and image formability can be reliably achieved.

Other preferred examples of the binder polymer include a polymer compound (hereinafter, also referred to as a "star type polymer compound") which has a polymer chain bonded to a nucleus through a sulfide bond by means of using a polyfunctional, in a range of hexa- to deca-functional, thiol as the nucleus and in which the polymer chain has a polymerizable group. As the star type polymer compound, for example, compounds described in JP2012-148555A can be preferably used.

Examples of the star type polymer compound include compounds having a polymerizable group such as an ethylenically unsaturated bond in the main chain or in the side chain, preferably in the side chain, for improving coated-film strength of an image portion as described in JP2008-195018A. Cross-linking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced into a polymer by a polymer reaction or copolymerization. For example, a reaction between a polymer having a carboxy group in the side chain thereof and glycidyl methacrylate or a reaction between a polymer having an epoxy group and ethylenically unsaturated group-containing carboxylic acid such as methacrylic acid can be used. These groups may be used in combination.

The content of the cross-linking group in the star type polymer compound is preferably in a range of 0.1 to 10.0 mmol, more preferably in a range of 0.25 to 7.0 mmol, and most preferably in a range of 0.5 to 5.5 mmol with respect to 1 g of the star type polymer compound.

Moreover, it is preferable that the star type polymer compound further includes a hydrophilic group. The hydrophilic group contributes to providing on-press developability for the image recording layer. Particularly, in the coexistence of a polymerizable group and a hydrophilic group, both of printing durability and developability can be achieved.

Examples of the hydrophilic group include —$SO_3M^1$, —OH, —$CONR^1R^2$ ($M^1$ represents hydrogen, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), —$N^+R^3R^4R^5X^-$ ($R^3$ to $R^5$ each independently represent an alkyl group having 1 to 8 carbon atoms and $X^-$ represents a counter anion), a group represented by the following Formula (1), and a group represented by the following Formula (2).

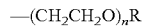 Formula (1)

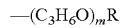 Formula (2)

In the above-described formulae, n and m each independently represent an integer of 1 to 100 and R's each independently represent a hydrogen atom or an alkyl group having 1 to 18 carbon atoms.

Here, in a case where the star type polymer compound is a star type polymer compound having a polyoxyalkylene chain (for example, a group represented by the above-described Formula (1) or (2)) in the side chain, such a star type polymer compound is a polymer compound having the above-described polyoxyalkylene chain in the side chain.

Among these hydrophilic groups, —$CONR^1R^2$, groups represented by Formula (1), and groups represented by Formula (2) are preferable, —$CONR^1R^2$ and groups represented by Formula (1) are more preferable, and groups represented by Formula (1) are particularly preferable. Among the groups represented by Formula (1), n represents an integer of preferably 1 to 10 and particularly preferably 1 to 4. Further, R represents more preferably a hydrogen atom or an alkyl group having 1 to 4 carbon atoms and particularly preferably a hydrogen atom or a methyl group. These hydrophilic groups may be used in combination of two or more kinds thereof.

Further, it is preferable that the star type polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. When the amount of these acid groups is less than 0.1 mmol/g, developability is further improved.

In order to control impressing properties, a lipophilic group such as an alkyl group, an aryl group, an aralkyl group, or an alkenyl group can be introduced to the star type polymer compound. Specifically, a lipophilic group-containing monomer such as methacrylic acid alkyl ester may be copolymerized.

Specific examples of the star type polymer compound include compounds described in paragraphs [0153] to [0157] of JP2014-104631A and the contents of which are incorporated in the specification of the present application.

The star type polymer compound can be synthesized, using a known method, by performing radical polymerization on the above-described monomers constituting a polymer chain in the presence of the above-described polyfunctional thiol compound.

The weight-average molecular weight (Mw) of the star type polymer compound is preferably in a range of 5,000 to 500,000, more preferably in a range of 10,000 to 250,000, and particularly preferably in a range of 20,000 to 150,000. When the weight-average molecular weight thereof is in the above-described range, the on-press developability and the printing durability are more improved.

The star type polymer compound may be used alone or in combination of two or more kinds thereof. Further, the star type polymer compound may be used in combination with a typical linear binder polymer.

The content of the star type polymer compound is preferably in a range of 5% to 95% by mass, more preferably in a range of 10% to 90% by mass, and particularly preferably in a range of 15% to 85% by mass with respect to the total solid content of the image recording layer.

From the viewpoint of promoting the permeability of dampening water and improving the on-press developability, star type polymer compounds described in JP2012-148555A are particularly preferable.

<Other Components>

The image recording layer A can contain other components described below.

(1) Low-Molecular Weight Hydrophilic Compound

In order to improve the on-press developability without degrading the printing durability, the image recording layer may contain a low-molecular weight hydrophilic compound.

As the low-molecular weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the image recording layer contains at least one selected from the group consisting of polyols, organic sulfates, organic sulfonates, and betaines.

Specific examples of the compounds of the organic sulfonates include compounds described in paragraphs [0026] to [0031] of JP2007-276454A and paragraphs [0020] to [0047] of JP2009-154525A. The salt may be potassium salt or lithium salt.

Examples of the organic sulfate include compounds described in paragraphs [0034] to [0038] of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular weight hydrophilic compound has a small structure of a hydrophobic portion and almost does not have a surface active action, hydrophobicity or coated-film strength of an image portion is not degraded by dampening water permeating into an image recording layer exposed portion (image portion) and ink receptivity or printing durability of the image recording layer can be maintained satisfactorily.

The amount of the low-molecular weight hydrophilic compounds to be added to the image recording layer is preferably in a range of 0.5% to 20% by mass with respect to the total amount of the solid content in the image recording layer. The amount thereof is more preferably in a range of 1% to 15% by mass and still more preferably in a range of 2% to 10% by mass. When the amount thereof is in the above-described range, excellent on-press developability and printing durability can be obtained.

These compounds may be used alone or in combination of two or more kinds thereof.

(2) Oil Sensitizing Agent

In order to improve the impressing property, an oil sensitizing agent such as a phosphonium compound, a nitrogen-containing low-molecular weight compound, or an ammonium group-containing polymer can be used for the image recording layer. Particularly, in a case where a protective layer contains an inorganic layered compound, the above-described compounds function as a surface coating agent of the inorganic layered compound and prevent a degradation in impressing property due to the inorganic layered compound during the printing.

The phosphonium compound, the nitrogen-containing low-molecular weight compound, and the ammonium group-containing polymer are described in paragraphs [0184] to [0190] of JP2014-104631A in detail and the contents of which are incorporated in the specification of the present application.

The content of the oil sensitizing agent is preferably in a range of 0.01% to 30.0% by mass, more preferably in a range of 0.1% to 15.0% by mass, and still more preferably in a range of 1% to 10% by mass with respect to the total solid content of the image recording layer.

(3) Other Components

The image recording layer may further contain other components such as a surfactant, a coloring agent, a printing-out agent, a polymerization inhibitor, a higher fatty acid derivative, a plasticizer, inorganic fine particles, an inorganic layered compound, a co-sensitizer, and a chain transfer agent. Specifically, the compounds and the addition amounts described in paragraphs [0114] to [0159] of JP2008-284817A, paragraphs [0023] to [0027] of JP2006-091479A, and paragraph [0060] of US2008/0311520A can be preferably used.

<Formation of Image Recording Layer A>

The image recording layer A is formed by dispersing or dissolving each of the above-described required components in a known solvent to prepare a coating solution, coating a support with the coating solution directly or through an undercoat layer using a known method such as a bar coater coating method, and drying the resultant, as described in paragraphs [0142] and [0143] of JP2008-195018A. The coating amount of the image recording layer (solid content) on the support to be obtained after the coating and the drying varies depending on the applications thereof, but is preferably in a range of 0.3 to 3.0 g/m$^2$. When the coating amount thereof is in the above-described range, excellent sensitivity and excellent film-coating characteristics of the image recording layer are obtained.

(Image Recording Layer B)

The image recording layer B contains an infrared absorbing agent, a polymerization initiator, a polymerizable compound, and a particulate polymer compound. Hereinafter, the constituent components of the image recording layer B will be described.

Similarly, the infrared absorbing agent, the polymerization initiator, and the polymerizable compound described in the image recording layer A can be used as an infrared absorbing agent, a polymerization initiator, and a polymerizable compound in the image recording layer B.

<Polymer Compound Having Particulate Shape>

It is preferable that the particulate polymer compound is selected from thermoplastic polymer fine particles, thermally reactive polymer fine particles, polymer fine particles having a polymerizable group, a microcapsule encapsulating a hydrophobic compound, and a microgel (cross-linked polymer fine particle). Among these, polymer fine particles having a polymerizable group and a microgel are preferable. According to a particularly preferred embodiment, the particulate polymer compound includes at least one ethylenically unsaturated polymerizable group. Because of the presence of the particulate polymer compound, effects of improving the printing durability of an exposed portion and the on-press developability of an unexposed portion are obtained.

Preferred examples of the thermoplastic polymer fine particles include hydrophobic thermoplastic polymer fine particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting thermoplastic polymer fine particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, styrene, a copolymer containing acrylonitrile, and polymethylmethacrylate are more preferable. The average particle diameter of the thermoplastic polymer fine particles is preferably in a range of 0.01 to 3.0 μm.

Examples of the thermally reactive polymer fine particles include polymer fine particles having a thermally reactive group. The thermally reactive polymer fine particles are cross-linked by a thermal reaction and have hydrophobic regions formed by a change in functional groups during the cross-linking.

As the thermally reactive group in polymer fine particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atoms as the reaction partners of these (such as an amino group, a hydroxy group, or a carboxy group); a carboxy group that performs a condensation reaction and a hydroxy group or an amino group as a reaction partner thereof; and an acid anhydride that performs a ring opening addition reaction and an amino group or a hydroxy group as a reaction partner thereof.

The microcapsule is a microcapsule in which at least a part of constituent components of the image recording layer are encapsulated as described in JP2001-277740A and JP2001-277742A. Further, the constituent components of the image recording layer may be contained in a portion other than the microcapsule. Moreover, a preferred embodiment of the image recording layer containing the microcapsule is an embodiment in which hydrophobic constituent components are encapsulated by a microcapsule and hydrophilic constituent components are contained by a portion other than the microcapsule.

The microgel (cross-linked polymer fine particles) may contain a part of the constituent components of the image recording layer in at least one of the surface or the inside thereof. From the viewpoints of image forming sensitivity and printing durability, a reactive microgel having a radical polymerizable group on the surface thereof is particularly preferable.

The constituent components of the image recording layer can be made into microcapsules or microgel particles using a known method.

The average particle diameter of the particulate polymer compound is, preferably in a range of 0.01 to 3.0 μm, more preferably in a range of 0.03 to 2.0 μm, and still more preferably in a range of 0.10 to 1.0 μm. When the average particle diameter thereof is in the above-described range, excellent resolution and temporal stability are obtained.

The content of the particulate polymer compound is preferably in a range of 5% to 90% by mass with respect to the total solid content of the image recording layer.

<Other Components>

The image recording layer B can contain other components described in the above-described image recording layer A as necessary.

<Formation of Image Recording Layer B>

The image recording layer B can be formed in the same manner as the image recording layer A described above.

(Image Recording Layer C)

The image recording layer C contains an infrared absorbing agent and thermoplastic polymer fine particles. Hereinafter, the constituent components of the image recording layer C will be described.

<Infrared Absorbing Agent>

The infrared absorbing agent contained in the image recording layer C is a dye or a pigment having maximum absorption at a wavelength of 760 to 1,200 nm. A dye is more preferable.

As the dye, commercially available dyes and known dyes described in the literatures (for example, "Dye Handbook" edited by The Society of Synthetic Organic Chemistry, Japan, published in 1970, "Infrared Absorbind Dyes" of "Chemical Industry", p. 45 to 51, published on May, 1986, and "Development and Market Trend of Functional Dyes in 1990's" Section 2.3 of Chapter 2 (CMC Publishing Co., Ltd., 1990)) and the patents can be used. Specific preferred examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable from the viewpoint of addition to the image recording layer.

Specific examples of the infrared absorbing dyes are described below, but the present invention is not limited thereto.

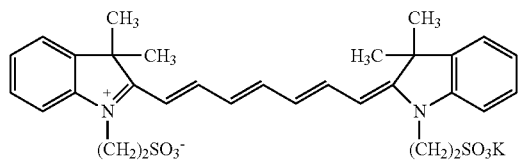
(IR-1)

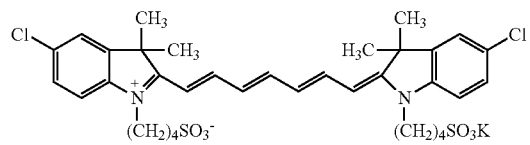
(IR-2)

-continued
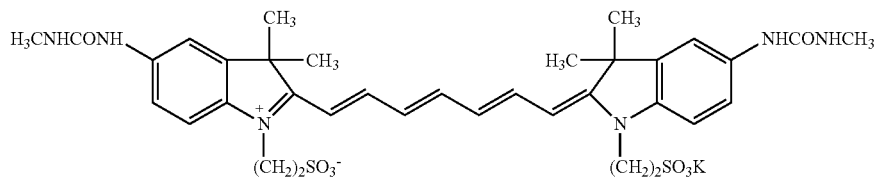
(IR-3)
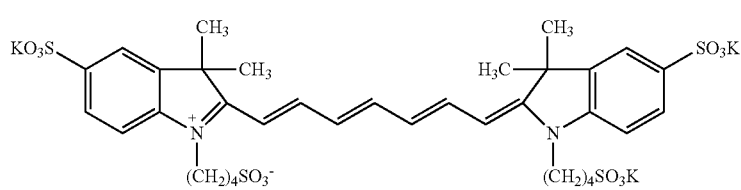
(IR-4)
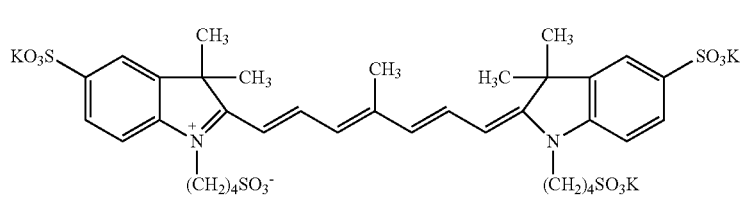
(IR-5)
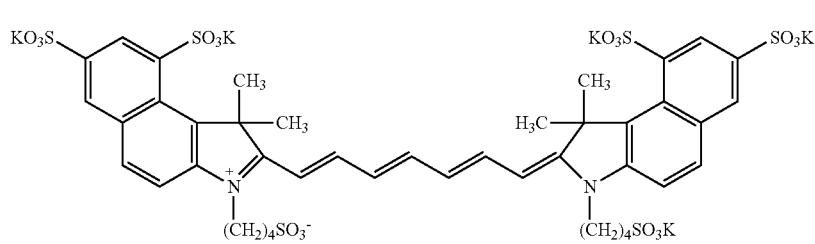
(IR-6)
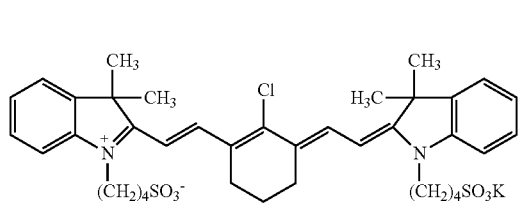
(IR-7)
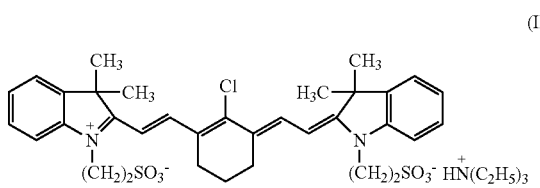
(IR-8)
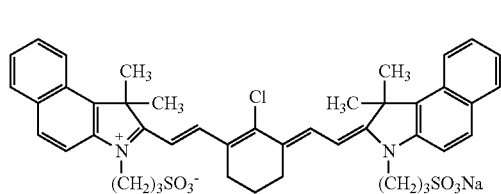
(IR-9)
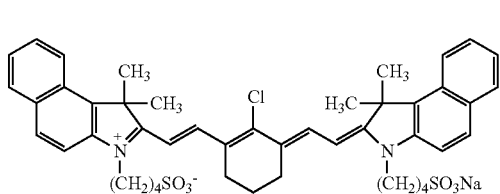
(IR-10)
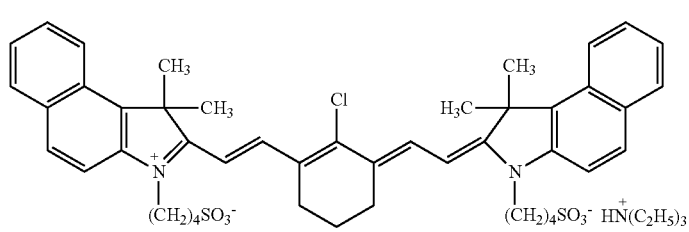
(IR-11)

As the pigments, commercially available pigments and pigments described in Color Index (C. I.) Handbook, "Latest Pigment Handbook" (edited by Japan Pigment Technology Association, 1977), "Latest Pigment Application Technology" (CMC Publishing Co., Ltd., 1986), and "Printing Ink Technology" (CMC. Publishing Co., Ltd., 1984) can be used.

The particle diameter of the pigment is preferably in a range of 0.01 to 1 µm and more preferably in a range of 0.01 to 0.5 µm. A known dispersion technique used to produce inks or toners can be used as a method of dispersing the pigment. The details are described in "Latest Pigment Application Technology" (CMC Publishing Co., Ltd., 1986).

The content of the infrared absorbing agent is preferably in a range of 0.1% to 30% by mass, more preferably in a range of 0.25% to 25% by mass, and particularly preferably in a range of 0.5% to 20% by mass with respect to the solid content of the image recording layer. When the content thereof is in the above-described range, excellent sensitivity is obtained without damaging the film hardness of the image recording layer.

<Thermoplastic Polymer Fine Particles>

The glass transition temperature (Tg) of the thermoplastic polymer fine particles is preferably in a range of 60° C. to 250° C. Tg of the thermoplastic polymer fine particles is more preferably in a range of 70° C. to 140° C. and still more preferably in a range of 80° C. to 120° C.

Preferred examples of the thermoplastic polymer fine particles having a Tg of 60° C. or higher include thermoplastic polymer fine particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene and polymethylmethacrylate are preferable.

The average particle diameter of the thermoplastic polymer fine particles is preferably in a range of 0.005 to 2.0 µm. When the average particle diameter is extremely large, the resolution may be degraded. Further, when the average particle diameter is extremely small, temporal stability may be degraded. This value is used as the average particle diameter in a case where two or more kinds of thermoplastic polymer fine particles are mixed with each other. The average particle diameter thereof is more preferably in a range of 0.01 to 1.5 µm and particularly preferably in a range of 0.05 µm to 1.0 µm. The polydispersity in a case where two or more kinds of thermoplastic polymer fine particles are mixed with each other is preferably 0.2 or greater. The average particle diameter and the polydispersity are calculated by laser light scattering.

The thermoplastic polymer fine particles may be used in combination of two or more kinds thereof. Specifically, at least two kinds of thermoplastic polymer fine particles with different particle sizes or at least two kinds of thermoplastic polymer fine particles with different glass transition temperatures may be exemplified. When two or more kinds of thermoplastic polymer fine particles are used in combination, coated-film curing properties of an image portion are further improved and printing durability in a case where a lithographic printing plate is obtained is further improved.

For example, in a case where thermoplastic polymer fine particles having the same particle size are used, voids are present between the thermoplastic polymer fine particles to some extent, the curing properties of the coated-film are not desirable in some cases even when the thermoplastic polymer fine particles are melted and solidified by image exposure. Meanwhile, in a case where thermoplastic polymer fine particles having different particle sizes are used, the void volume between the thermoplastic polymer fine particles can be decreased and thus the coated-film curing properties of the image portion after image exposure can be improved.

Further, in a case where thermoplastic polymer fine particles having the same Tg are used, the thermoplastic polymer fine particles are not sufficiently melted and solidified and, accordingly, the coated-film curing properties are not desirable in some cases when an increase in temperature of the image recording layer resulting from image exposure is insufficient. Meanwhile, in a case where thermoplastic polymer fine particles having different glass transition temperatures are used, the coated-film curing properties of the image portion can be improved when an increase in temperature of the image recording layer resulting from image exposure is insufficient.

In a case where two or more kinds of thermoplastic polymer fine particles having different glass transition temperatures are used in combination, the Tg of at least one thermoplastic polymer fine particle is preferably 60° C. or higher. At this time, a difference in Tg is preferably 10° C. or higher and more preferably 20° C. or higher. In addition, the content of the thermoplastic polymer fine particles having a Tg of 60° C. or higher is 70% by mass or greater with respect to the total amount of all thermoplastic polymer fine particles.

The thermoplastic polymer fine particles may include a cross-linking group. When thermoplastic polymer fine particles having a cross-linking group are used, the cross-linking group is thermally reacted due to heat generated by an image-exposed portion, cross-linking occurs between polymers, coated-film strength of an image portion is improved, and printing durability becomes more excellent. As the cross-linking group, a functional group, in which any reaction may occur, is not limited as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having active hydrogen atoms as the reaction partners of these (such as an amino group, a hydroxy group, or a carboxy group); an epoxy group that performs an addition reaction and an amino group, a carboxy group or a hydroxy group as reaction partners thereof; a carboxy group that performs a condensation reaction and a hydroxy group or an amino group; and an acid anhydride that performs a ring opening addition reaction and an amino group or a hydroxy group.

Specific examples of the thermoplastic polymer fine particles having a cross-linking group include thermoplastic polymer fine particles having cross-linking groups such as an acryloyl group, a methacryloyl group, a vinyl group, an allyl group, an epoxy group, an amino group, a hydroxy group, a carboxy group, an isocyanate group, an acid anhydride, and a group protecting these. These cross-linking groups may be introduced to polymers at the time of polymerization of fine particle polymers or may be introduced using a polymer reaction after polymerization of fine particle polymers.

In a case where a cross-linking group is introduced to a polymer at the time of polymerization of polymer fine particles, it is preferable that a monomer having a cross-linking group may be subjected to an emulsion polymerization or suspension polymerization. Specific examples of the monomer having a cross-linking group include allyl methacrylate, allyl acrylate, vinyl methacrylate, vinyl acrylate, glycidyl methacrylate, glycidyl acrylate, 2-isocyanate ethyl methacrylate or block isocyanate resulting from alcohol thereof, 2-isocyanate ethyl acrylate or block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate.

Examples of the polymer reaction used in a case where a cross-linking group is introduced after polymerization of polymer fine particles include polymer reactions described in WO96/34316A.

Polymer fine particles may react with each other through a cross-linking group or the thermoplastic polymer fine particles may react with a polymer compound or a low-molecular weight compound added to the image recording layer.

The content of the thermoplastic polymer fine particles is preferably in a range of 50% to 95% by mass, more preferably in a range of 60% to 90% by mass, and particularly preferably in a range of 70% to 85% by mass with respect to the solid content of the image recording layer.

<Other Components>

The image recording layer C may contain other components as necessary.

<Surfactant Having Polyoxyalkylene Group or Hydroxy Group>

As a surfactant having a polyoxyalkylene group (hereinafter, also referred to as a POA group) or a hydroxy group, a surfactant having a POA group or a hydroxy group may be suitably used, but an anionic surfactant or a non-ionic surfactant is preferable. Among anionic surfactants or non-ionic surfactants having a POA group or a hydroxy group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of an oxyalkylene group is practically in a range of 2 to 50 and preferably in a range of 2 to 20.

The number of hydroxy groups is practically 1 to 10 and preferably in a range of 2 to 8. Here, the number of terminal hydroxy groups in the oxyalkylene group is not included in the number of hydroxy groups.

(Anionic Surfactant Having POA Group or Hydroxy Group)

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenylether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxy group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxy group is preferably in a range of 0.05% to 15% by mass and more preferably in a range of 0.1% to 10% by mass with respect to the solid content of the image recording layer.

Hereinafter, specific examples of the surfactant having a POA group or a hydroxy group will be described, but the present invention is not limited thereto. A surfactant A-12 described below is a trade name of Zonyl FSP and available from Dupont. Further, a surfactant N-11 described below is a trade name of Zonyl FSO 100 and available from Dupont.

A-1

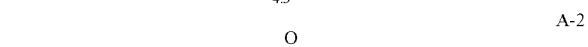

A-2

A-3

A-4

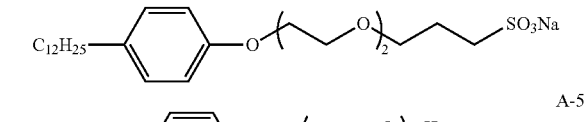

A-5

A-6

A-7

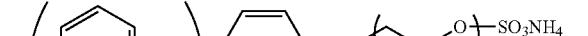

A-8

A-9

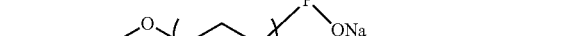

A-10

A-11
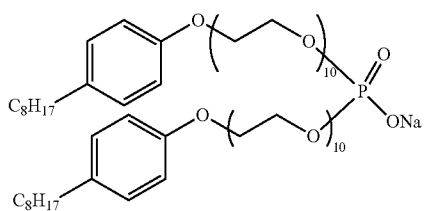

A-12
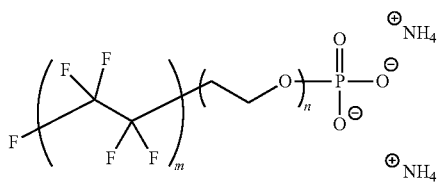

A-13
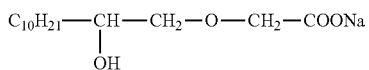

A-14
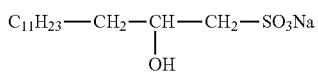

A-15
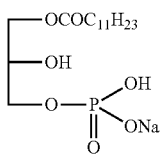

N-1

N-2
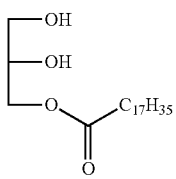

N-3
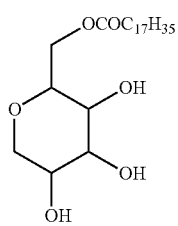

N-4
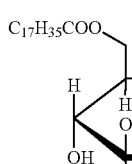

N-5
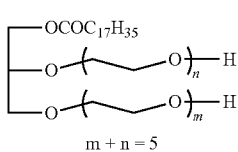
m + n = 5

N-6
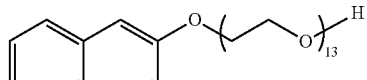

N-7
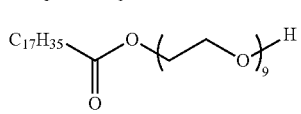

N-8
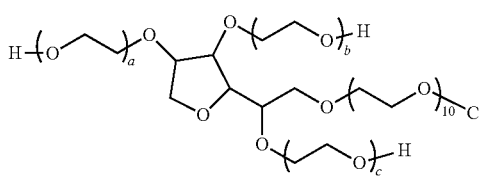
a + b + c = 20

N-9
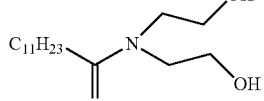

N-10
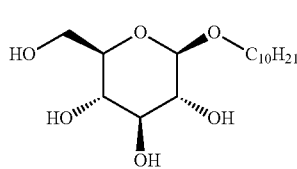

N-11
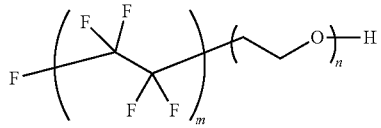

For the purpose of ensuring coating uniformity of the image recording layer, the image recording layer may contain an anionic surfactant that does not have a polyoxyalkylene group or a hydroxy group.

The anion surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxy group is preferably in a range of 1% to 50% by mass and more preferably in a range of 1% to 30% by mass with respect to the surfactant which has a polyoxyalkylene group or a hydroxy group.

Hereinafter, specific examples of the anionic surfactant that does not have a polyoxyalkylene group or a hydroxy group will be described, but the present invention is not limited thereto.

AA-1

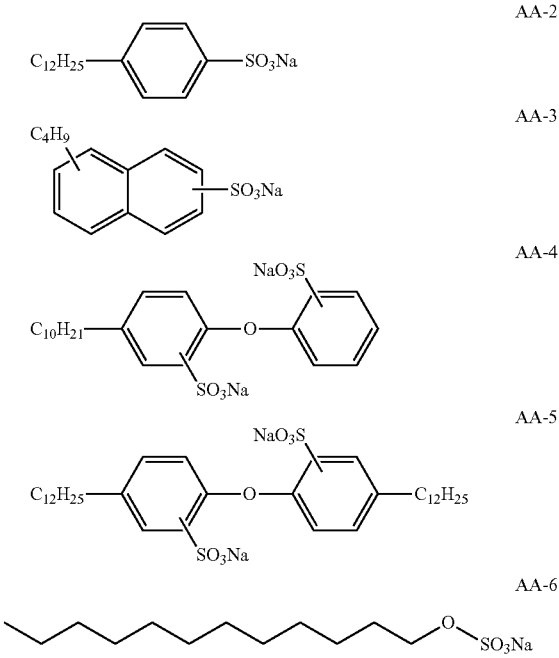

Further, for the purpose of coating uniformity of the image recording layer, a non-ionic surfactant that does not have a polyoxyalkylene group or a hydroxy group or a fluorine surfactant may be used. For example, fluorine surfactants described in JP1987-170950A (JP-S62-170950A) are preferably used.

The image recording layer may contain a hydrophilic resin. Preferred examples of the hydrophilic resin include resins having hydrophilic groups such as a hydroxy group, a hydroxyethyl group, a hydroxypropyl group, an amino group, an aminoethyl group, an aminopropyl group, a carboxy group, a carboxylate group, a sulfo group, a sulfonate group, and a phosphoric acid group.

Specific examples of the hydrophilic resin include gum Arabic, casein, gelatin, a starch derivative, carboxy methyl cellulose and sodium salt thereof, cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxy ethyl methacrylate, a homopolymer and a copolymer of hydroxy ethyl acrylate, a homopolymer and a copolymer of hydroxy propyl methacrylate, a homopolymer and a copolymer of hydroxy propyl acrylate, a homopolymer and a copolymer of hydroxy butyl methacrylate, a homopolymer and a copolymer of hydroxy butyl acrylate, polyethylene glycols, hydroxy propylene polymers, polyvinyl alcohols, hydrolyzed polyvinyl acetate having a degree of hydrolysis of at least 60% and preferably at least 80%, polyvinyl formal, polyvinyl butyral, polyvinyl pyrrolidone, a homopolymer and a copolymer of acrylamide, a homopolymer and a copolymer of methacrylamide, and a homopolymer and a copolymer of N-methylol acrylamide.

The weight average molecular weight of the hydrophilic resin is preferably 2,000 or greater from the viewpoints of obtaining sufficient coated-film strength or printing durability.

The content of the hydrophilic resin is preferably in a range of 0.5% to 50% by mass and more preferably in a range of 1% to 30% by mass with respect to the solid content of the image recording layer.

The image recording layer may contain inorganic fine particles. Preferred examples of the inorganic fine particles include silica, alumina, magnesium oxide, titanium oxide, magnesium carbonate, calcium alginate, and a mixture of these. The inorganic fine particles can be used for the purpose of improving coated-film strength.

The average particle diameter of the inorganic fine particles is preferably in a range of 5 nm to 10 μm and more preferably in a range of 10 nm to 1 μm. When the average particle diameter thereof is in the above described range, the thermoplastic polymer fine particles are stably dispersed, the film hardness of the image recording layer is sufficiently held, and a non-image portion with excellent hydrophilicity in which printing stain is unlikely to occur can be formed.

The inorganic fine particles are available as commercial products such as a colloidal silica dispersion and the like.

The content of the inorganic fine particles is preferably in a range of 1.0% to 70% by mass and more preferably in a range of 5.0% to 50% by mass with respect to the solid content of the image recording layer.

The image recording layer may contain a plasticizer in order to provide flexibility for a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% to 50% by mass and more preferably in a range of 1% to 30% by mass with respect to the solid content of the image recording layer.

In a case where polymer fine particles having a thermally reactive functional group (cross-linking group) are used for the image recording layer, a compound that starts or promotes a reaction of the thermally reactive functional group (cross-linking group) can be added to the image recording layer as necessary. As the compound that starts or promotes a reaction of the thermally reactive functional group, a compound that generates a radical or a cation by heating may be exemplified. Examples of the compound include a lophine dimer, a trihalomethyl compound, a peroxide, an azo compound, onium salts including diazonium salts and diphenyl iodonium salts, acyl phosphine, and imide sulfonate. The amount of the compound to be added to the image recording layer is preferably in a range of 1% to 20% by mass and more preferably in a range of 1% to 10% by mass with respect to the solid content of the image recording layer. When the amount thereof is in the above-described range, on-press developability is not degraded and excellent effects for starting or promoting a reaction are obtained.

<Formation of Image Recording Layer C>

The image recording layer C is formed by dissolving or dispersing each of the above-described required components in a suitable solvent to prepare a coating solution, coating a support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% to 50% by volume. Here, it is necessary that the amount of the organic solvent to be used is set such that the thermoplastic polymer fine particles are not aggregated. The concentration of solid contents of the image recording layer coating solution is preferably in a range of 1% to 50% by mass.

As the organic solvent used as a solvent of the coating solution, a water-soluble organic solvent is preferable. Specific examples thereof include an alcohol solvent such as methanol, ethanol, propanol, isopropanol, or 1-methoxy-2-propanol, a ketone solvent such as acetone or methyl ethyl ketone, a glycol ether solvent such as ethylene glycol dimethyl ether, γ-butyrolactone, N,N-dimethylformamide, N,N-dimethylacetamide, tetrahydrofuran, and dimethylsulfoxide. Particularly, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the image recording layer coating solution, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the support obtained after the coating and the drying varies depending on the purpose thereof, but is preferably in a range of 0.5 to 5.0 g/m$^2$ and more preferably in a range of 0.5 to 2.0 g/m$^2$.

Hereinafter, other constituent elements of the lithographic printing plate precursor will be described.

[Undercoat Layer]

The lithographic printing plate precursor may be provided with an undercoat layer between the image recording layer and the support as necessary. Since bonding of the support to the image recording layer becomes stronger in an exposed portion and the support is easily separated from the image recording layer in an unexposed portion, the undercoat layer contributes to improvement of the on-press developability without degrading the printing durability. Further, in a case of infrared layer exposure, the undercoat layer functions as a heat insulating layer so that a degradation in sensitivity due to heat, generated by exposure, being diffused in the support is prevented.

Examples of eth compound used for the undercoat layer include a silane coupling agent having an ethylenic double bond reaction group, which can be added and polymerized, described in JP1998-282679A (JP-H10-282679A); and a phosphorous compound having an ethylenic double bond reaction group described in JP1990-304441A (JP-H02-304441A). Preferred examples thereof include polymer compounds having an adsorptive group which can be adsorbed to the surface of the support, a hydrophilic group, and a cross-linking group, as described in JP2005-125749A and JP2006-188038A. As such a polymer compound, a copolymer of a monomer having an adsorptive group, a monomer having a hydrophilic group, and a monomer having a cross-linking group is preferable. Specific examples thereof include a copolymer of a monomer having an adsorptive group such as a phenolic hydroxy group, a carboxy group, —PO$_3$H$_2$, —OPO$_3$H$_2$, —CONHSO$_2$—, —SO$_2$NHSO$_2$—, or —COCH$_2$COCH$_3$, a monomer having a hydrophilic group such as a sulfo group, and a monomer having a polymerizable cross-linking group such as a methacryl group or an allyl group. The polymer compound may include a cross-linking group introduced by forming salts between a polar substituent of the polymer compound and a compound that includes a substituent having the opposite charge and an ethylenic unsaturated bond. Further, monomers other than the monomers described above, preferably hydrophilic monomers may be further copolymerized.

The content of the unsaturated double bond in the polymer compound for an undercoat layer is preferably in a range of 0.1 to 10.0 mmol and more preferably in a range of 2.0 to 5.5 mmol with respect to 1 g of the polymer compound.

The weight-average molecular weight of the polymer compound for an undercoat layer is preferably 5,000 or greater and more preferably in a range of 10,000 to 300,000.

For the purpose of preventing stain over time, the undercoat layer may contain a chelating agent, a secondary or tertiary amine, a polymerization inhibitor, an amino group, a compound that includes an amino group or a functional group having polymerization inhibiting ability and a group interacting with the surface of an aluminum support, and the like (for example, 1,4-diazabicyclo[2,2,2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount (solid content) of the undercoat layer is preferably in a range of 0.1 to 100 mg/m$^2$ and more preferably in a range of 1 to 30 mg/m$^2$.

[Support]

A known support is used as the support of the lithographic printing plate precursor. Among examples of the known support, an aluminum plate subjected to a roughening treatment and an anodizing treatment using a known method is preferable.

The aluminum plate can be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. Nos. 2,714,066A, 3,181,461A, 3,280,734A, and 3,902,734A or polyvinyl phosphonic acid described in U.S. Pat. Nos. 3,276,868A, 4,153,461A, and 4,689,272A as necessary.

The center line average roughness of the support is preferably in a range of 0.10 to 1.2 μm.

The rear surface of the support may be provided with an organic polymer compound described in JP1993-45885A (JP-H05-45885A) and a back coat layer containing an alkoxy compound of silicon described in JP1994-35174A (JP-H06-35174A) as necessary.

[Protective Layer]

A protective layer may be provided on the image recording layer of the precursor as necessary. The protective layer has a function of suppressing a reaction of inhibiting image formation through oxygen blocking, a function of preventing generation of damage to the image recording layer, and a function of preventing ablation at the time of high illuminance laser exposure.

As the protective layer having such functions, a protective layer described in paragraphs [0202] to [0204] of JP2014-104631A can be used and the contents of which are incorporated in the specification of the present application.

The protective layer is applied according to a known method. The coating amount of the protective layer after the drying is preferably in a range of 0.01 to 10 g/m$^2$, more preferably in a range of 0.02 to 3 g/m$^2$, and particularly preferably in a range of 0.02 to 1 g/m$^2$.

[Method of Producing Lithographic Printing Plate Precursor]

As described above, the end portion regions of the lithographic printing plate precursor of the present invention contain the specific polymer with a higher content than those of other regions. The method of producing a lithographic printing plate precursor is not particularly limited as long as a lithographic printing plate precursor having such a configuration is obtained. Hereinafter, the method of producing a lithographic printing plate precursor according to the present invention will be described.

The specific polymer can be introduced to the end portion regions of the lithographic printing plate precursor by applying a coating solution containing the specific polymer to the end portion regions of the lithographic printing plate precursor during the step of producing the lithographic printing plate precursor. The coating solution containing the specific polymer may be applied to the end portion regions of the lithographic printing plate precursor at any timing of the step of producing the lithographic printing plate precursor, and it is preferable that the coating solution is applied thereto before and after the step of forming each configuration layer, that is, before the coating of the lowermost layer (for example, the undercoat layer) to after the drying of the uppermost layer (for example, the protective layer). The lithographic printing plate precursor may be cut before or after the coating solution containing the specific polymer is applied to the end portion regions of the lithographic printing plate precursor.

In other words, in the step of forming each configuration layer of the lithographic printing plate, the lithographic printing plate precursor may be cut such that the end portion regions of the lithographic printing plate precursor are formed after the coating solution containing the specific polymer is applied to positions corresponding to the end portion regions of the lithographic printing plate precursor. Alternatively, the coating solution containing the specific polymer may be applied to the end portion regions of the lithographic printing plate precursor after the lithographic printing plate precursor produced by performing the step of forming each configuration layer of the lithographic printing plate precursor is cut. Here, the positions corresponding to the end portion regions indicate positions in which regions on the plate surface on the image recording layer side from the end portion to a portion inside the end portion by 5 mm of the cut lithographic printing plate precursor can be formed. Accordingly, the positions corresponding to the end portion regions may be positions in the vicinity of the ends of the lithographic printing plate precursor or positions in the vicinity of the center of the lithographic printing plate precursor in the step of producing the lithographic printing plate precursor. In a case where the positions are positions in the vicinity of the center of the lithographic printing plate precursor, two sheets of lithographic printing plate precursors having end portion regions are obtained by cutting the lithographic printing plate precursor such that the end portion regions are formed along the region coated with the specific polymer.

As an embodiment in which the lithographic printing plate precursor is cut such that the end portion regions thereof are formed after the coating solution containing the specific polymer is applied to the positions corresponding to the end portion regions of the lithographic printing plate precursor in the step of forming each configuration layer of the lithographic printing plate precursor, for example, the following method may be preferably exemplified.

In a lithographic printing plate precursor including a support and an image recording layer on the support, a method of producing a lithographic printing plate precursor of performing an image recording layer forming step a of forming the image recording layer; a coating step b of coating a part of a region of the image recording layer which is formed by the step a with a coating solution containing the specific polymer such that the coating solution and the region overlap each other; and a cutting step c of cutting the region coated with the coating solution to be in a range on the plate surface on the image recording layer side from the end portion of the cut lithographic printing plate precursor to a portion inside the end portion by 5 mm, in order of the step a, the step b, and then the step c or in order of the step b, the step a, and then the step c, on the support, is exemplified.

Further, a protective layer forming step e of forming a protective layer may be performed on the image recording layer after the step a and before the step c.

In a lithographic printing plate precursor including a support, and an undercoat layer and an image recording layer provided on the support in this, order, a method of producing a lithographic printing plate precursor of performing an image recording layer forming step a of forming the image recording layer; a coating step b of coating a part of a region of the image recording layer which is formed by the step a with a coating solution containing the specific polymer such that the coating solution and the region overlap each other; a cutting step c of cutting the region coated with the coating solution to be in a range on the plate surface on the image recording layer side from the end portion of the cut lithographic printing plate precursor to a portion inside the end portion by 5 mm; and an undercoat layer forming step d of forming the undercoat layer, in order of the step b, the step d, the step a, and then the step c, in order of the step d, the step b, the step a, and then the step c, or in order of the step d, the step a, the step b, and then the step c, on the support, is exemplified.

In a lithographic printing plate precursor including a support, and an undercoat layer, an image recording layer and a protective layer provided on the support in this order, a method of producing a lithographic printing plate precursor of performing an image recording layer forming step a of forming the image recording layer; a coating step b of coating a part of a region of the image recording layer which is formed by the step a with a coating solution containing the specific polymer such that the coating solution and the region overlap each other; a cutting step c of cutting the region coated with the coating solution to be in a range on the plate surface on the image recording layer side from the end portion of the cut lithographic printing plate precursor to a portion inside the end portion by 5 mm; an undercoat layer forming step d of forming the undercoat layer; and a protective layer forming step e of forming a protective layer, in order of the step b, the step d, the step a, the step e, and then the step c, in order of the step d, the step b, the step a, the step e, and then the step c, in order of the step d, the step a, the step b, the step e, and then the step c, or in order of the step d, the step a, the step e, the step b, and then the step c, on the support, is exemplified.

As an embodiment in which the coating solution containing the specific polymer is applied to the end portion regions of the lithographic printing plate precursor after the lithographic printing plate precursor produced by performing a step of forming each configuration layer of the lithographic printing plate precursor is cut, for example, the following method may be preferably exemplified.

In a lithographic printing plate precursor including a support and an image recording layer on the support, a method of producing a lithographic printing plate precursor of performing an image recording layer forming step a of forming the image recording layer; and a coating step f of coating a region on the plate surface on the image recording layer side, from the end portion of the lithographic printing plate precursor to a portion inside the end portion by 5 mm, with a coating solution containing the specific polymer, in order of the step a and the step f on the support, is exemplified.

Further, a protective layer forming step e of forming a protective layer may be performed on the image recording layer after the step a and before the step f.

In a lithographic printing plate precursor including a support, and an undercoat layer and an image recording layer provided on the support in this order, a method of producing a lithographic printing plate precursor of performing an image recording layer forming step a of forming the image recording layer; a coating step f of coating a region on the plate surface of the image recording layer side, from the end portion of the lithographic printing plate precursor to a portion inside the end portion by 5 mm, with a coating solution containing the specific polymer; and an undercoat layer forming step d of forming the undercoat layer, in order of the step d, the step a, and the step f on the support is exemplified.

In a lithographic printing plate precursor including a support, and an undercoat layer, an image recording layer and a protective layer provided on the support in this order, a method of producing a lithographic printing plate precursor of performing an image recording layer forming step a of forming the image recording layer; a coating step f of coating a region on the plate surface on the image recording layer side, from the end portion of the lithographic printing plate precursor to a portion inside the end portion by 5 mm, with a coating solution containing the specific polymer; an undercoat layer forming step d of forming the undercoat layer; and a protective layer forming step e of forming a protective layer, in order of the step d, the step a, the step e, and the step f on the support is exemplified.

The step of forming the configuration layer includes at least a step of coating the configuration layer. A step of drying the coated layer after coating the configuration layer is not necessarily required for the step of forming the configuration layer. For example, the support is coated with an undercoat layer and then coated with a coating solution containing the specific polymer without drying the coated layer. In this case, it is considered that the specific polymer is present not only on the undercoat layer and but also in the undercoat layer.

[Specific Polymer-Containing Coating Solution]

The specific polymer-containing coating solution is a coating solution containing the specific polymer described above. It is preferable that the specific polymer-containing coating solution is in the form of an aqueous solution in which the specific polymer is dissolved in a medium mainly formed of water.

It is preferable that the specific polymer-containing coating solution contains the above-described hydrophilic compound. The content of the hydrophilic compound in the specific polymer-containing coating solution is preferably in a range of 0.03% to 20.0% by mass and more preferably in a range of 0.05% to 10% by mass with respect to the total mass of the specific polymer-containing coating solution.

It is preferable that the specific polymer-containing coating solution may contain a water-soluble resin other than the specific polymers. Similar to the above-described specific polymers, the water-soluble resin has an effect of hydrophilizing cracks which can be generated at the time when a shear drop shape described below is formed and preventing stain generated due to accumulation of printing ink in the cracks. Examples of the water-soluble resin include water-soluble resins classified as polysaccharides, polyvinyl alcohol, polyvinyl pyrrolidone, polyacrylamide, and a copolymer of these, a vinyl methyl ether-maleic anhydride copolymer, a vinyl acetic acid-maleic anhydride copolymer, and a styrene-maleic anhydride copolymer.

Examples of the polysaccharides include starch derivatives (such as dextrin, enzymatically decomposed dextrin, hydroxypropylated starch, carboxymethylated starch, phosphoric acid esterified starch, polyoxyalkylene grafted starch, and cyclodextrin); celluloses (such as carboxymethyl cellulose, carboxyethyl cellulose, methyl cellulose, hydroxypropyl cellulose, and methylpropyl cellulose); carrageenan, alginic acid, guar gum, locust bean gum, xanthan gum, gum Arabic, and soybean polysaccharides.

Among the water-soluble resins, starch derivatives such as dextrin and polyoxyalkylene grafted starch, gum Arabic, carboxymethyl cellulose, and soybean polysaccharides are preferably used.

The water-soluble resin may be used in combination of two or more kinds thereof. The content of the water-soluble resin is preferably in a range of 0.5% to 30% by mass and more preferably in a range of 1% to 10% by mass with respect to the total mass of the specific polymer-containing coating solution. When the content thereof is in the above-described range, the effects of the water-soluble resin are achieved satisfactorily.

The specific polymer-containing coating solution may further contain a surfactant, an organic solvent, a plasticizer, and other additives.

(Surfactant)

Examples of the surfactant used for the specific polymer-containing coating solution include anionic surfactants, non-ionic surfactants, cationic surfactants, and amphoteric surfactants. Among these, anionic surfactants and non-ionic surfactants are preferable. The surfactant contributes to adjustment of coating properties of the specific polymer-containing coating solution.

Examples of the anionic surfactant include compounds described in paragraph of [0022] of JP2014-104631A and the contents of which are incorporated in the specification of the present application.

Among the above-described anionic surfactants, dialkyl sulfosuccinates, alkyl sulfonic acid ester salts, polyoxyethylene aryl ether sulfonic acid ester salts, and alkyl naphthalene sulfonates are preferable.

Specifically, anionic surfactants represented by the following Formula (I-A) or (I-B) may be exemplified.

(I-A)

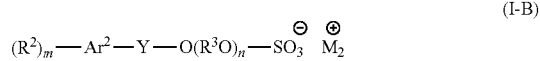

(I-B)

In Formula (I-A), $R^1$ represents a linear or branched alkyl group having 1 to 20 carbon atoms; p represents 0, 1, or 2; $Ar^1$ represents an aryl group having 6 to 10 carbon atoms; q represents 1, 2, or 3; and $M_1^+$ represents $Na^+$, $K^+$, $Li^+$, or $NH_4^+$. When p represents 2, a plurality of $R^1$'s may be the same as or different from each other.

In Formula (I-B), $R^2$ represents a linear or branched alkyl group having 1 to 20 carbon atoms; m represents 0, 1, or 2; $Ar^2$ represents an aryl group having 6 to 10 carbon atoms; Y represents a single bond or an alkylene group having 1 to 10 carbon atoms; $R^3$ represents a linear or branched alkylene group having 1 to 5 carbon atoms; n represents an integer of 1 to 100; and $M_2^+$ represents $Na^+$, $K^+$, $Li^+$, or $NH_4^+$. When m represents 2, a plurality of $R^2$'s may be the same as or different from each other. When n represents 2 or greater, a plurality of $R^3$'s may be the same as or different from each other.

In Formulae (I-A) and (I-B), preferred examples of $R^1$ and $R^2$ include $CH_3$, $C_2H_5$, $C_3H_7$, and $C_4H_9$. Further, preferred examples of $R^3$ include —$CH_2$—, —$CH_2CH_2$—, —$CH_2CH_2CH_2$—, and —$CH_2CH(CH_3)$—. Among these, —$CH_2CH_2$— is more preferable. Moreover, it is preferable that p and m represent 0 or 1 and particularly preferable that p represents 0. It is preferable that Y represents a single bond. Further, it is preferable that n represents an integer of 1 to 20.

Specific examples of the anionic surfactants represented by Formula (I-A) or (I-B) include the following compounds.

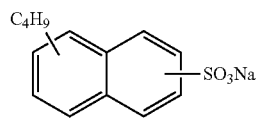 (1)

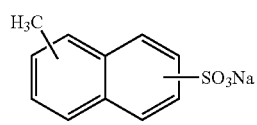 (2)

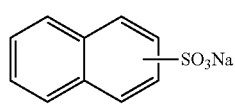 (3)

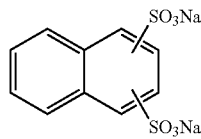 (4)

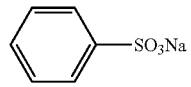 (5)

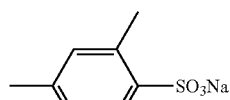 (6)

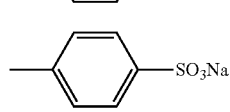 (7)

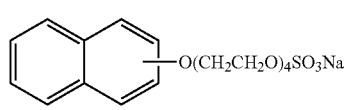 (8)

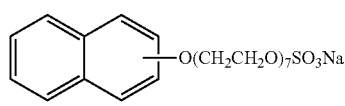 (9)

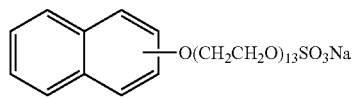 (10)

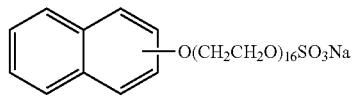 (11)

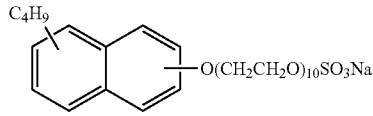 (12)

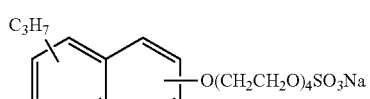 (13)

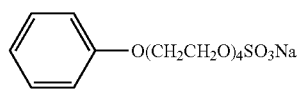 (14)

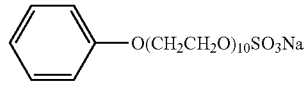 (15)

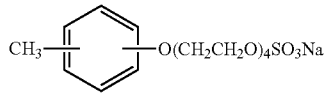 (16)

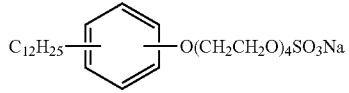 (17)

Examples of the non-ionic surfactant include compounds described in paragraph of [0031] of JP2014-104631A and the contents of which are incorporated in the specification of the present application.

Among the above-described non-ionic surfactants, polyoxyethylene aryl ethers and polyoxyethylene-polyoxypropylene block copolymers are preferable.

Specific preferred examples include non-ionic surfactants represented by the following Formula (II-A).

$$(R^4)_s—Ar^3—O(CH_2CH_2O)_t(CH_2CH(CH_3)O)_uH \quad \text{(II-A)}$$

In Formula (II-A), $R^4$ represents a hydrogen atom or an alkyl group having 1 to 20 carbon atoms, s represents 0, 1, or 2, $Ar^3$ represents an aryl group having 6 to 10 carbon atoms, and t and u each independently represent an integer of 0 to 100 and either of t and u does not represent 0. In a case where s represents 2, a plurality of $R^4$'s may be the same as or different from each other.

Examples of the compound represented by Formula (II-A) include polyoxyethylene phenyl ether, polyoxyethylene methyl phenyl ether, polyoxyethylene octyl phenyl ether, polyoxyethylene nonyl phenyl ether, polyoxyethylene naphthyl ether, polyoxyethylene methyl naphthyl ether, polyoxyethylene octyl naphthyl ether, and polyoxyethylene nonyl naphthyl ether.

In the compounds represented by Formula (II-A), the number (t) of repeating units of the polyoxyethylene chain is preferably in a range of 2 to 50 and more preferably in a range of 4 to 30. The number (u) of repeating units of the polyoxypropylene chain is preferably in a range of 0 to 10 and more preferably in a range of 0 to 5. The polyoxyethylene portion and the polyoxypropylene portion may be present randomly or in the form of a block.

Specific examples of the non-ionic surfactant represented by Formula (II-A) are described below. An oxyethylene repeating unit and an oxypropylene repeating unit in the compound "Y-5" exemplified below may be in the form of any of a random bond and block connection.

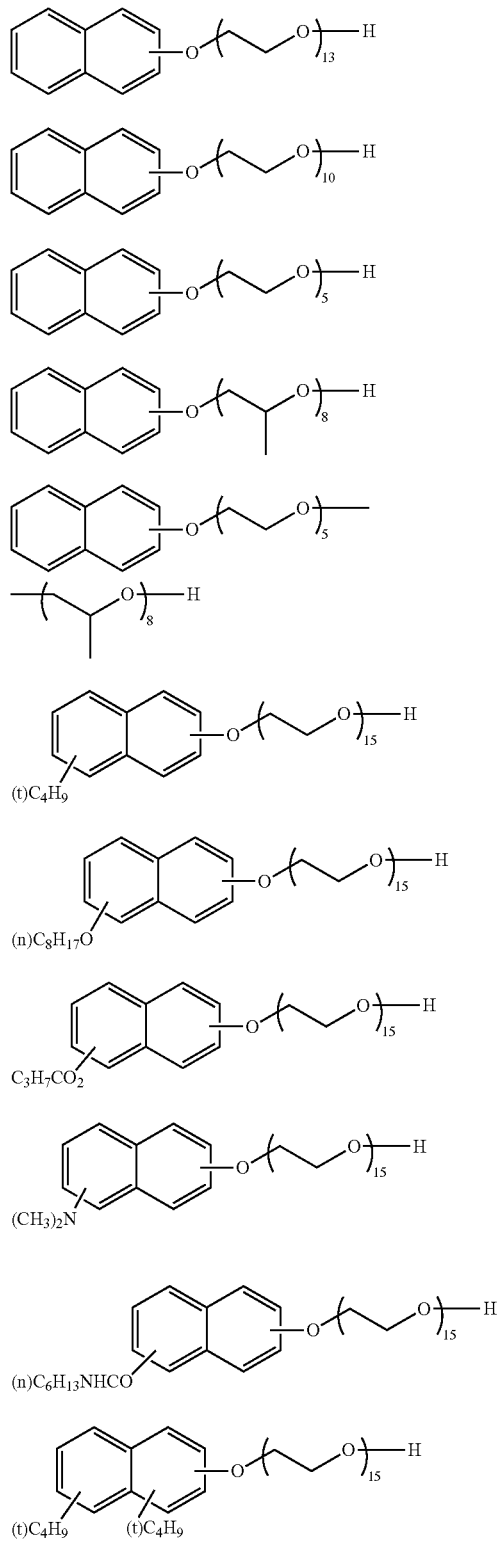

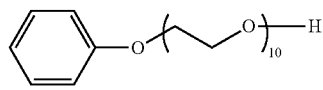

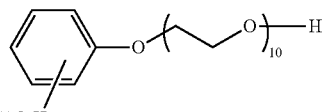

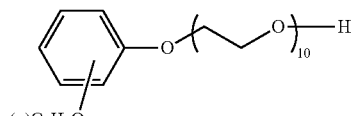

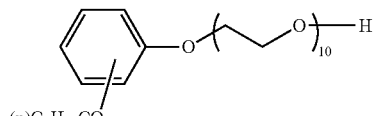

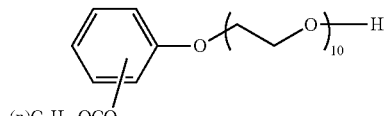

The surfactant may be used in combination of two or more kinds thereof. Examples thereof include a combination of two or more kinds of anionic surfactants different from each other, a combination of two or more kinds of non-ionic surfactants different from each other, and a combination of an anionic surfactant and a non-ionic surfactant.

The content of the surfactant in the specific polymer-containing coating solution is preferably in a range of 0.01% to 20% by mass and more preferably in a range of 0.1% to 15% by mass with respect to the total mass of the coating solution.

(Organic Solvent)

An organic solvent may be contained for the purpose of adjusting the solubility of the water-soluble resin and promoting swelling of the image recording layer. Examples of the organic solvent include an alcohol-based solvent, a ketone-based solvent, an ester-based solvent, an amide-based solvent, and a hydrocarbon-based solvent. Among the organic solvents, an alcohol-based solvent is preferably used.

Examples of the alcohol-based solvent include methyl alcohol, n-propyl alcohol, iso-propyl alcohol, n-butyl alcohol, tert-butyl alcohol, n-amyl alcohol, diacetone alcohol, 1-methoxy-2-propanol, furfuryl alcohol, 2-octanol, 2-ethylhexanol, nonanol, n-decanol, undecanol, n-dodecanol, trimethyl nonyl alcohol, benzyl alcohol, phenethyl alcohol, ethylene glycol monoisoamyl ether, ethylene glycol monophenyl ether, ethylene glycol monobenzyl ether, and ethylene glycol monohexyl ether. Among these, benzyl alcohol, phenethyl alcohol, and furfuryl alcohol are preferable.

The organic solvent may be used in combination of two or more kinds thereof. The content of the organic solvent is preferably in a range of 0.5% to 10% by mass and more preferably in a range of 1% to 5% by mass with respect to the total mass of the specific polymer-containing coating solution. When the content thereof is in the above-described range, the effects of the organic solvent are achieved satisfactorily.

(Plasticizer)

Examples of the plasticizer include plasticizers having a freezing point of 15° C. or lower, for example, phthalic acid diesters such as dibutyl phthalate, diheptyl phthalate, di-n-octyl phthalate, di(2-ethylhexyl) phthalate, dinonyl phthalate, didecyl phthalate, dilauryl phthalate, and butyl benzyl phthalate; aliphatic dibasic acid esters such as dioctyl adipate, butyl glycol adipate, dioctyl azelate, dibutyl sebacate, di(2-ethylhexyl) sebacate, and dioctyl sebacate; epoxidized triglycerides such as epoxidized soybean oil; phosphoric acid esters such as tricresyl phosphate, trioctyl phosphate, and trischloroethyl phosphate; and benzoic acid esters such as benzyl benzoate.

The plasticizer may be used in combination of two or more kinds thereof. The content of plasticizer is preferably in a range of 0.5% to 10% by mass and more preferably in a range of 1% to 5% by mass with respect to the total mass of the specific polymer-containing coating solution.

(Other Additives)

The specific polymer-containing coating solution may contain water-soluble inorganic salts such as nitrate and sulfate, water-soluble organic compounds such as a polyol, a betaine, organic sulfonate, organic sulfate, organic carboxylate, and amino acid, a preservative, and an antifoaming agent in addition to the above-described components.

Examples of the inorganic salts include magnesium nitrate, sodium nitrate, potassium nitrate, ammonium nitrate, sodium sulfate, potassium sulfate, ammonium sulfate, sodium hydrogen sulfate, and nickel sulfate.

Examples of the inorganic salts include magnesium nitrate, sodium nitrate, potassium nitrate, ammonium nitrate, sodium sulfate, potassium sulfate, ammonium sulfate, sodium hydrogen sulfate, and nickel sulfate.

The polyol includes an aliphatic polyol compound, an alicyclic polyol compound, and a nitrogen-containing heterocyclic polyol compound.

The number of hydroxy groups in a molecule of the polyol is practically in a range of 2 to 6 and preferably in a range of 3 to 6.

Examples of the aliphatic polyol compound include ethylene glycol, diethylene glycol, triethylene glycol, tetraethylene glycol, propylene glycol, neopentyl glycol, 1,3-butylene glycol, 1,4-butanediol, 1,5-pentanediol, cis-2-butene-1,4-diol, trans-2-butene-1,4-diol, di-1,2-propylene glycol, di-1,3-propylene glycol, tri-1,3-propylene glycol, glycerin, 1,1,1-trimethylolpropane, hexanetriol, pentaerythritol, sorbitol, hydroxy polyesters obtained from polyvalent carboxylic acid and polyhydric alcohol, and hydroxy polyalkylene ether which is a condensate of polyhydric alcohol and alkylene oxide.

Examples of the alicyclic polyol compound include cyclohexane dimethanol and inositol.

Examples of the nitrogen-containing heterocyclic polyol compound include tris(2-hydroxyethyl)isocyanurate and 1,4-bis(2-hydroxyethyl)piperazine.

Among the examples of the polyol, an aliphatic polyol compound and a nitrogen-containing heterocyclic polyol compound are preferable and an aliphatic polyol compound is particularly preferable.

As the betaine, a betaine compound having 1 to 5 carbon atoms of a hydrocarbon group bonded to nitrogen atoms is preferable. Specific examples thereof include trimethyl ammonium acetate, dimethyl propyl ammonium acetate, 3-hydroxy-4-trimethylammoniobutylate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propanesulfonate, and 3-(1-pyridinio)-1-propanesulfonate.

As the organic sulfonate, a compound including organic sulfamate and having 1 to 8 carbon atoms is preferable and a compound including organic sulfamate and having 1 to 5 carbon atoms is more preferable. An alkali metal salt (a sodium salt, a potassium salt, or a lithium salt) is preferable as a salt. Specific examples of the organic sulfonate include sodium methanesulfonate, sodium n-butyl sulfonate, sodium isobutyl sulfonate, sodium sec-butyl sulfonate, sodium tert-butyl sulfonate, sodium n-pentyl sulfonate, sodium 1,2-dimethyl propyl sulfonate, sodium 1-ethyl propyl sulfonate, sodium n-hexyl sulfonate, sodium 2-ethyl butyl sulfonate, sodium cyclohexyl sulfonate, sodium n-heptyl sulfonate, sodium allyl sulfonate, sodium 2-methyl allyl sulfonate, sodium n-butyl sulfamate, sodium isobutyl sulfamate, sodium tert-butyl sulfamate, sodium n-pentyl sulfamate, sodium 1,2-dimethyl propyl sulfamate, sodium 1-ethyl propyl sulfamate, sodium n-hexyl sulfamate, sodium 2-ethyl butyl sulfamate, and sodium cyclohexyl sulfamate. The sodium salt in the above-described specific examples may be a potassium salt or a lithium salt.

As the organic sulfate, a compound having 1 to 7 carbon atoms is preferable and a compound having 1 to 5 carbon atoms is more preferable. The organic sulfate includes an alkyl, alkenyl, or alkynyl of polyethylene oxide or a sulfate of heterocyclic monoether. The number of ethylene oxide units is preferably in a range of 1 to 4. As a salt, an alkali metal salt (a sodium salt, a potassium salt, or a lithium salt) is preferable. Specific examples of the organic sulfate include sodium 2-methoxy ethyl sulfate.

As the organic carboxylate, a compound having 1 to 6 carbon atoms is preferable and a compound having 1 to 4 carbon atoms is more preferable. In this case, the number of carbon atoms does not include the number of carbon atoms of a carboxy group. As the salt thereof, an alkali metal salt (a sodium salt, a potassium salt, or a lithium salt) is preferable. Among the alkali metal salts, a sodium salt or a potassium salt is preferable and a sodium salt is more preferable. Examples of the organic carboxylic acid include aliphatic monocarboxylic acid such as formic acid, acetic acid, propionic acid, butyric acid, valeric acid, caproic acid, or enanthic acid; unsaturated aliphatic monocarboxylic acid such as crotonic acid; aliphatic dicarboxylic acid such as oxalic acid, succinic acid, adipic acid, or maleic acid; oxycarboxylic acid such as glycolic acid, lactic acid, gluconic acid, malic acid, tartaric acid, or citric acid; and polycarboxylic acid such as ethylene tetracarboxylic acid. Among the examples of the organic carboxylic acid, monocarboxylic acid, dicarboxylic acid or oxycarboxylic acid is preferable and dicarboxylic acid or oxycarboxylic acid is more preferable.

As the organic carboxylate, an alkali metal salt of the above-described carboxylic acid is preferable. An alkali metal salt of monocarboxylic acid, dicarboxylic acid, or oxycarboxylic acid is more preferable and an alkali metal salt of dicarboxylic acid or oxycarboxylic acid is particularly preferable. Specific examples of the organic carboxylate include sodium formate, sodium acetate, sodium propionate, sodium crotonate, disodium oxalate, disodium succinate, disodium adipate, disodium maleate, sodium glycolate, sodium lactate, sodium gluconate, sodium malate, disodium tartrate, potassium sodium tartrate, monosodium citrate, disodium citrate, and trisodium citrate.

The amino acid includes a so-called amino acid having a carboxy group and an amino group in the same molecule and an N-substitute formed by introducing a hydrocarbon group to an amino acid.

Specific examples of the amino acid include glycine, alanine, β-alanine, valine, leucine, norleucine, threonine, methionine, cysteine, γ-aminobutyric acid, asparagine, hydroxylysine, arginine, and histidine.

The hydrocarbon group which can be introduced to an N-substitute of an amino acid is a hydrocarbon group having 3 or less carbon atoms, and examples thereof include an alkyl group such as a methyl group, an ethyl group, a propyl group, or an isopropyl group. Specific examples of the N-substitute formed by introducing a hydrocarbon group to an amino acid include sarcosine and N,N-dimethyl glycine.

Examples of the preservative include phenol or a derivative thereof, formalin, an imidazole derivative, sodium dehydroacetate, a 4-isothiazolin-3-one derivative, benzoisothiazolin-3-one, a benzotriazole derivative, an amidine guanidine derivative, derivatives of quaternary ammonium salts, pyridine, quinoline, and guanidine, diazine, a triazole derivative, oxazole, an oxazine derivative, and nitro bromo alcohol-based 2-bromo-2-nitropropane-1,3-diol, 1,1-dibromo-1-nitro-2-ethanol, and 1,1-dibromo-1-nitro-2-propanol.

Examples of the anti-foaming agent include a typical silicon-based self-emulsification type non-ionic surfactant, an emulsification type non-ionic surfactant, and a non-ionic surfactant having an HLB of 5 or less.

<Preparation of Specific Polymer-Containing Coating Solution>

The specific polymer-containing coating solution is prepared by adding the specific polymer and additives used as necessary to water (distilled water, ion exchange water, or demineralized water).

The content of the specific polymer in the specific polymer-containing coating solution is preferably in a range of 0.05% to 50% by mass, more preferably in a range of 0.1% to 30% by mass, and particularly preferably in a range of 0.2% to 10% by mass.

The viscosity of the specific polymer-containing coating solution at 25° C. is preferably in a range of 0.5 to 1,000 mPa·s and more preferably in a range of 1 to 100 mPa·s. From the viewpoints that bead breakage is unlikely to occur and the coating at the time of starting application is smoothly carried out, it is preferable that the viscosity thereof is in the above-described range.

The surface tension of the specific polymer-containing coating solution at 25° C. is preferably in a range of 25 to 70 mN/m and more preferably in a range of 40 to 65 mN/m. From the viewpoints that the coating width is easily controlled and bead breakage is unlikely to occur, it is preferable that the surface tension thereof is in the above-described range.

[Application of Specific Polymer-Containing Coating Solution]

As described above, the specific polymer-containing coating solution is applied to positions corresponding to the end portion regions in the step of production of the lithographic printing plate precursor. The coating width is preferably a region from an end portion or a position corresponding to the end portion to a portion inside the end portion by 5 mm and more preferably a region from an end portion or a position corresponding to the end portion to a portion inside the end portion by 3 mm.

The specific polymer-containing coating solution can be applied using known methods such as a die coating method, a dip coating method, an air knife coating method, a curtain coating method, a roller coating method, a wire bar coating method, a gravure coating method, a slide coating method, an ink-jet method, a dispenser method, and a spray method. From the viewpoint of applying the coating solution to a specific position, an ink-jet method or a dispenser method is preferable.

According to the embodiment in which the specific polymer-containing coating solution is applied after the lithographic printing plate precursor is cut, a coating method of using cloth or a Molton roll impregnated with the specific polymer-containing coating solution can be used in addition to the above-described coating methods.

The coating amount of the specific polymer-containing coating solution is preferably in a range of 0.05 to 5.0 g/m$^2$ and more preferably in a range of 0.1 to 2.0 g/m$^2$ as a solid content after drying.

The specific polymer-containing coating solution is applied and then dried. The drying may be performed after the specific polymer-containing coating solution is applied or after the lithographic printing plate precursor is coated with a coating solution for forming a configuration layer.

The drying may be performed by blowing dry air using an oven. The drying temperature is preferably in a range of 60° C. to 250° C. and more preferably in a range of 80° C. to 160° C.

[Cutting of Lithographic Printing Plate Precursor]

The lithographic printing plate precursor is cut during the step of production of the lithographic printing plate precursor as described above. The cutting may be performed using known cutting methods. Preferred examples thereof include methods described in JP1996-58257A (JP-H08-58257A), JP1997-211843A (JP-H09-211843A), JP1998-100556A (JP-H10-100556A), and JP1999-52579A (JP-H11-52579A).

It is preferable that the end portions of the lithographic printing plate precursor have a shear drop shape. The lithographic printing plate precursor having end portions in a shear drop shape has excellent effects of preventing edge stain together with the specific polymer-containing end portion regions of the present invention.

FIG. 1 is a view schematically illustrating the cross-sectional shape of a lithographic printing plate precursor.

In FIG. 1, a lithographic printing plate precursor 1 includes a shear drop 2 in the end portion thereof. A distance X between the upper end (boundary point between the shear drop 2 and the end surface 1$c$) of an end surface 1$c$ of the lithographic printing plate precursor 1 and the extension line of an image recording layer surface (protective layer surface in a case where a protective layer is formed) 1$a$ is referred to as an "amount of shear drop" and a distance Y between the starting point of shear drop of the image recording layer surface 1$a$ of the lithographic printing plate precursor 1 and the extension line of the end surface 1$c$ is referred to as a "width of shear drop". The amount of shear drop of the end portion of the lithographic printing plate precursor is preferably 35 μm or greater and more preferably 40 μm or greater. From the viewpoint of preventing degradation of on-press developability caused by deterioration in the surface state of the end portion, the upper limit of the amount of shear drop is preferably 150 μm. When the on-press developability is degraded, ink is adhered to the remaining image recording layer and, as the result, edge stain is generated. When the amount of shear drop is less than 35 μm, the ink adhering to the end portion is easily transferred to a blanket and this may cause edge stain. In a case where the amount of shear drop is in a range of 35 to 150 μm, when the width of shear drop is small, cracks are generated in the end portion so that printing ink is accumulated in the cracks, and this leads to generation of edge stain. In order to decrease the generation of cracks, the width of shear drop is practically in a range of 70 to 300 μm and preferably in a range of 80 to 250 μm. Further, the preferable ranges of the amount of shear drop and the width of shear drop are not relevant to the edge shape of a support surface 1b of the lithographic printing plate precursor 1.

Similar to the image recording layer surface 1a, the shear drop is generated typically in a boundary B between the image recording layer and the support, and the support surface 1b in end portions of the lithographic printing plate precursor 1.

An end portion having the shear drop can be formed by adjusting the conditions of cutting the lithographic printing plate precursor.

Specifically, the end portion can be formed by adjusting a gap between an upper cutting blade and a lower cutting blade in a slitter device used at the time of cutting the lithographic printing plate precursor, the amount of biting, the blade tip angle, and the like.

Figure 2:
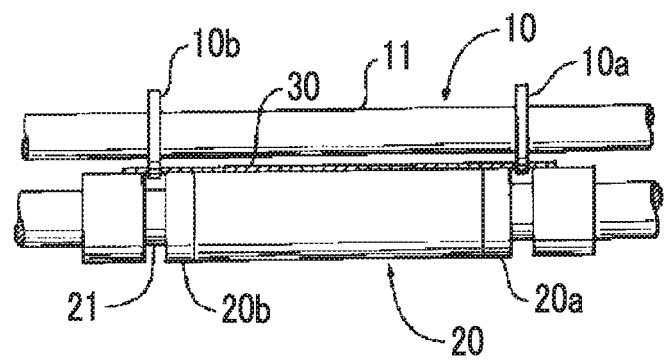
FIG. 2 is a conceptual view illustrating an example of a cutting portion of a slitter device.

For example, FIG. 2 is a cross-sectional view illustrating a cutting portion of a slitter device. A pair of upper and lower cutting blades 10 and 20 are horizontally disposed in the slitter device. The cutting blades 10 and 20 are respectively formed of a round blade on a circular plate and upper cutting blades 10a and 10b are supported by a rotary shaft 11 and lower cutting blades 20a and 20b are supported by a rotary shaft 21 respectively on the same axis. The upper cutting blades 10a and 10b and the lower cutting blades 20a and 20b rotate in opposite directions. A lithographic printing plate precursor 30 passes through the space between the upper cutting blades 10a and 10b and the space between the lower cutting blades 20a and 20b and then cut to have a predetermined width. An end portion with the shear drop can be formed by adjusting the gap between the upper cutting blade 10a and the lower cutting blade 20a and the gap between the upper cutting blade 10b and the lower cutting blade 20b of the cutting portion of the slitter device.

The plate-making of the lithographic printing plate precursor of the present invention will be described below. According to a preferred embodiment, the plate-making of the lithographic printing plate precursor of the present invention includes image exposure and on-press development.

[Image Exposure]

The image exposure of the lithographic printing plate precursor can be performed in conformity with an image exposure operation for a typical lithographic printing plate precursor.

The image exposure is performed by laser exposure through a transparent original picture having a line image, a halftone image, and the like or by laser beam scanning using digital data. The wavelength of a light source is preferably in a range of 700 to 1,400 nm. As the light source having a wavelength of 700 to 1,400 nm, a solid-state laser or a semiconductor laser that radiates infrared rays is preferable. The output of the infrared laser is preferably 100 mW or greater, the exposure time per one pixel is preferably less than 20 microseconds, and the irradiation energy quantity is preferably in a range of 10 to 300 mJ/cm$^2$. For the purpose of reducing the exposure time, it is preferable to use a multi-beam laser device. The exposure mechanism may be any of an internal drum system, an external drum system, and a flat bed system. The image exposure can be performed using a plate setter according to a usual method.

[On-Press Development and Printing]

The on-press development and printing of the lithographic printing plate precursor can be performed according to a usual method. In other words, when dampening water and printing ink are supplied to the image-exposed lithographic printing plate precursor on a printing press, a printing ink receiving portion having a lipophilic surface is formed by the image recording layer cured by light exposure in the exposed portion of the image recording layer. Meanwhile, in an unexposed portion, a non-cured image recording layer is dissolved or dispersed by supplied dampening water and/or printing ink and then removed, a hydrophilic surface is exposed to the portion. As the result, dampening water is exposed and adheres to the hydrophilic surface, the printing ink is impressed on the image recording layer of the exposed region, and then the printing is started.

Here, either of dampening water or printing ink may be initially supplied to the surface of the lithographic printing plate precursor, but it is preferable that dampening water is initially supplied thereto by infiltrating dampening water so that the on-press developability is promoted.

In the plate-making of the lithographic printing plate precursor according to the present invention, a plate-making system used for a treatment using a typical developer can be employed. That is, a plate-making system including an exposed portion which performs image exposure on the lithographic printing plate precursor using an exposure machine; a developing treatment unit which removes an unexposed portion of the lithographic printing plate precursor image-exposed by the exposed portion using an automatic developing machine; and a processing unit which performs processing using a punch vender for mounting the lithographic printing plate precursor on the printing press, in this order, can be used.

In a case of on-press development, since the development processing unit is not necessary, the plate-making may be carried out using a system from which the development treatment unit is excluded or may be carried out while the development treatment unit remains. In a case where the plate-making is performed while the development treatment unit remains, the plate-making is carried out without preparing a developer, water, and a gum solution used in a developing unit, a water washing unit, and a finisher unit of the development treatment unit so that the development treatment unit can be used as a conveying unit from the exposed portion to the processing unit.

Further, the development treatment unit can be used as the conveying device from the exposed portion to the processing unit by connecting an insertion roller portion and a plate discharge roller portion of the development treatment unit using the conveying device such that the surface of the lithographic printing plate to be conveyed such as a belt conveyor on the photosensitive layer side can be conveyed without coming into contact with any portion in a conveyance path and skipping the developing unit, the water washing unit, and the finisher unit.

In addition, a development treatment unit having a conveyance path separated from the path that conveys the lithographic printing plate precursor to the developing unit, the water washing unit, and the finisher unit described in JP2006-65169A can be used.

The lithographic printing plate precursor has an excellent characteristic of furnishing a lithographic printing plate in which adhesion to interleaving paper is prevented, contamination inside a device is prevented, and edge stain does not occur. This characteristic is remarkable in an on-press development type lithographic printing plate precursor. Particularly, in a case where printing paper having a larger width than the width of the lithographic printing plate precursor is used, as newspaper printing, and printing is carried out, the lithographic printing plate precursor of the present invention exhibits the excellent characteristic. In this case, the width of the lithographic printing plate precursor corresponds to the length of the lithographic printing plate precursor in the lateral direction at the time of being attached to the plate cylinder of the printing press.

Therefore, the lithographic printing plate precursor of the present invention exhibits particularly excellent characteristics as an on-press development type lithographic printing plate precursor used for printing newspaper.

EXAMPLES

Hereinafter, the present invention will be described in detail with reference to examples, but the present invention is not limited thereto. Further, in a polymer compound, the molecular weight indicates the weight-average molecular mass (Mw) and the proportion of repeating units indicates mole percentage unless otherwise specified.

Examples 1 to 32 and Comparative Examples 1 to 12

[Preparation of Lithographic Printing Plate Precursor 1]
<Preparation of Support>

An aluminum alloy plate having a thickness of 0.3 mm and having a composition listed in Table A was subjected to the following treatments (a) to (m), whereby a support was produced. Moreover, during all treatment steps, a washing treatment was performed, and liquid cutting was performed using a nip roller after the washing treatment.

TABLE A

| Composition (% by mass) | | | | | | | |
|---|---|---|---|---|---|---|---|
| Si | Fe | Cu | Mn | Mg | Zn | Ti | Al |
| 0.085 | 0.303 | 1 0.037 | 0 | 0 | 0 | 0.018 | Remainder |

(a) Mechanical Roughening Treatment (Brush Grain Method)

Figure 3:
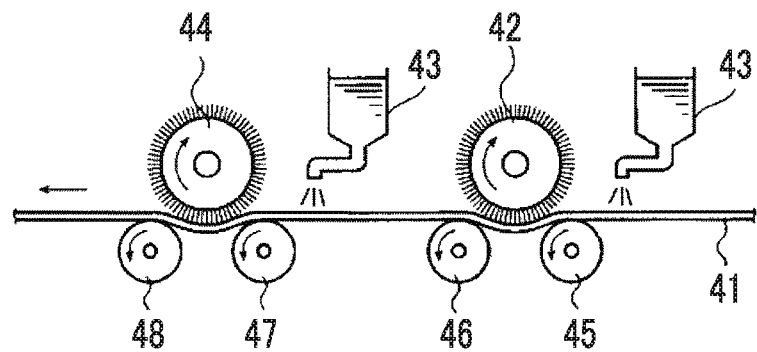
FIG. 3 is a side view illustrating the concept of a brush graining step used for a mechanical roughening treatment in production of a support for a lithographic printing plate.

While supplying a suspension of pumice (specific gravity of 1.1 g/cm$^3$) to the surface of an aluminum plate as a polishing slurry liquid, with a device illustrated in FIG. 3, a mechanical roughening treatment was performed using rotating bundle bristle brushes. In FIG. 3, the reference numeral 41 is an aluminum plate, the reference numerals 42 and 44 are roller-shaped brushes (in the present example, bundle bristle bushes), the reference numeral 43 is a polishing slurry liquid, and the reference numerals 45, 46, 47, and 48 are support rollers.

The mechanical roughening treatment is performed under conditions in which the median diameter of a polishing material pumice was 30 μm, the number of the bundle bristle brushes was four, and the rotation speed of the bundle bristle brushes was set to 250 rpm. The material of the bundle bristle brushes was nylon 6.10, the diameter of the brush bristles was 0.3 mm, and the bristle length was 50 mm. The bundle bristle brushes were produced by implanting bristles densely into the holes in a stainless steel cylinder having a diameter of ϕ300 mm. The distance between two support rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the bundle bristle brushes was the same as the moving direction of the aluminum plate.

(b) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(c) Desmutting Treatment in Acidic Aqueous Solution

Next, a desmutting treatment was performed in a nitric acid aqueous solution. As the nitric acid aqueous solution used in the desmutting treatment, a nitric acid electrolyte used in electrochemical roughening of the subsequent step was used. The temperature was 35° C. The desmutting treatment was performed for 3 seconds by spraying the desmutting liquid using a spray.

(d) Electrochemical Roughening Treatment

Figure 4:
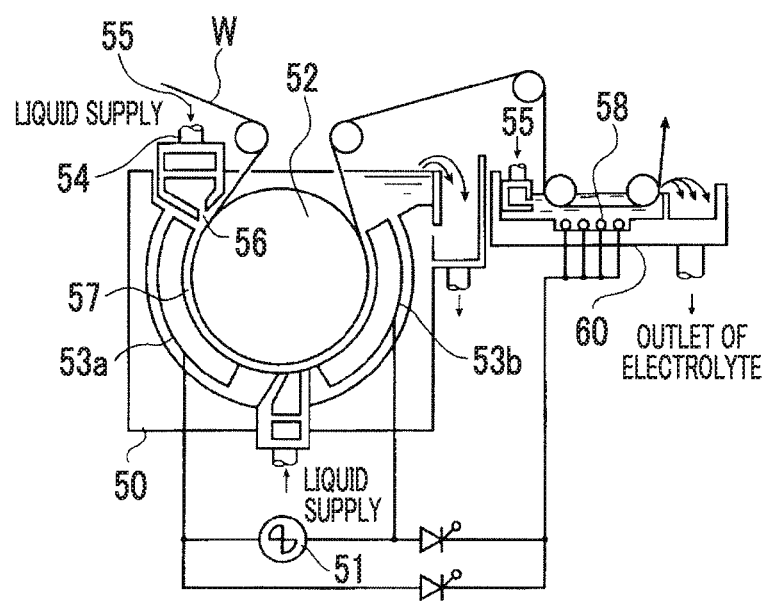
FIG. 4 is a side view illustrating an example of a radial type cell used for an electrochemical roughening treatment for which an alternating current is used in production of a support for a lithographic printing plate.

An electrochemical roughening treatment was continuously performed using an AC voltage of 60 Hz. An electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp, until the current value reached a peak from zero, of 0.8 msec and the duty ratio of 1:1 as the AC power supply waveform, the electrochemical roughening treatment was performed using a carbon electrode as a counter electrode. As an auxiliary anode, ferrite was used. As an electrolytic cell, the electrolytic cell illustrated in FIG. 4 was used. In FIG. 4, an aluminum plate W was wound around a radial drum roller 52 disposed in a state of being immersed in a main electrolytic cell 50 and subjected to an electrolytic treatment by main poles 53a and 53b connected to an AC power supply 51 in the step of conveyance. The electrolyte 55 was supplied to an electrolyte passage 57 between the radial drum roller 52 and the main poles 53a and 53b through a slit 56 from an electrolyte supply port 54. The aluminum plate W treated by the main electrolytic cell 50 was subjected to an electrolytic treatment by an auxiliary anode vessel 60. An auxiliary anode 58 were disposed to face the aluminum plate W in the auxiliary anode vessel 60 and the electrolyte 55 was supplied so as to flow the space between the auxiliary anode 58 and the aluminum plate W. The current density was 30 A/dm$^2$ as the peak current value, and 5% of the current from the power source was separately flowed to the auxiliary anode. The electric quantity was 185 C/dm$^2$ as the sum total of electric quantity at the time of anodization of the aluminum plate. Thereafter, washing with water by spraying was performed.

(e) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 60° C. The desmutting treatment was performed for 3 seconds by spraying the desmutting liquid using a spray.

(g) Electrochemical Roughening Treatment

An electrochemical roughening treatment was continuously performed using an AC voltage of hydrochloric acid electrolysis 60 Hz. An electrolyte which had been adjusted to have a concentration of aluminum ions of 4.5 g/L by adding aluminum chloride to an aqueous solution having a concentration hydrochloric acid of 6.2 g/L at a liquid temperature of 35° C. was used. Using a trapezoidal rectangular waveform AC having a time tp, until the current value reached a peak from zero, of 0.8 msec and the duty ratio of 1:1, the electrochemical roughening treatment was performed using a carbon electrode as a counter electrode. As an auxiliary anode, ferrite was used. As an electrolytic cell, the electrolytic cell illustrated in FIG. 4 was used. The current density was 25 A/dm$^2$ as the peak current value, and the electric quantity in the hydrochloric acid electrolysis was 63 C/dm$^2$ as the sum total of electric quantity at the time of anodization of the aluminum plate. Thereafter, washing with water by spraying was performed.

(h) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(i) Desmutting Treatment in Acidic Aqueous Solution

Next, a desmutting treatment was performed in a sulfuric acid aqueous solution. The desmutting treatment was performed at a solution temperature of 35° C. for 4 seconds using the sulfuric acid aqueous solution (aluminum ions having a concentration of 5 g/L were contained in a sulfuric acid aqueous solution having a concentration of 170 g/L) used for the anodizing treatment step. The desmutting treatment was performed for 3 seconds by spraying the desmutting liquid using a spray.

(j) First Anodizing Treatment

Figure 5:
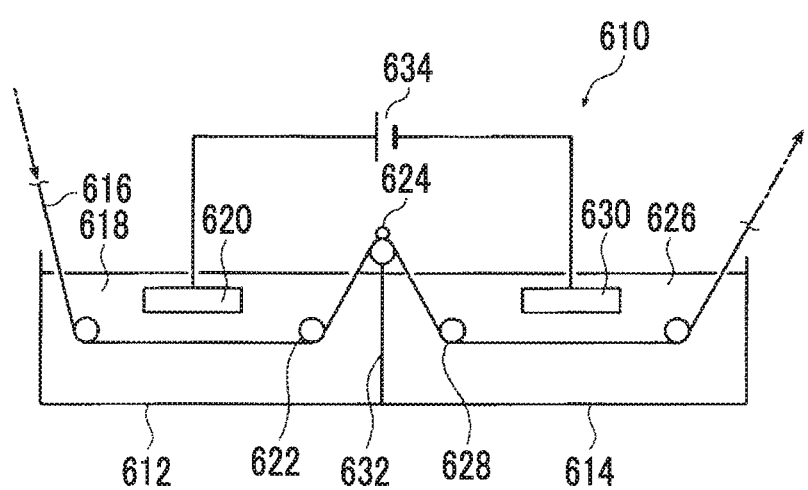
FIG. 5 is a schematic view illustrating an anodizing treatment device used for an anodizing treatment in production of a support for a lithographic printing plate.

A first step of an anodizing treatment was performed with an anodizing device using DC electrolysis having a structure illustrated in FIG. 5. An anodized film having a predetermined film thickness was formed by performing an anodizing treatment under conditions listed in Table B. An aqueous solution containing components listed in Table B was used as the electrolyte. In Tables B to D, the "component concentration" indicates the concentration (g/L) of each component described in the section of "liquid component".

TABLE B

First anodizing treatment

| Liquid type | Liquid component | Component concentration (g/L) | Temperature (° C.) | Current density (A/dm$^2$) | Time (s) | Film thickness (nm) |
|---|---|---|---|---|---|---|
| Sulfuric acid | H$_2$SO$_4$/Al | 170/5 | 55 | 90 | 0.40 | 110 |

In an anodizing treatment device 610 illustrated in FIG. 5, an aluminum plate 616 was conveyed as indicated by arrows in FIG. 5. The aluminum plate 616 in a power supply vessel 612 in which an electrolyte 618 was stored was positively (+) charged by a power supply electrode 620. Further, the aluminum plate 616 was conveyed upward by a roller 622 in the power supply vessel 612, the conveyance direction of the aluminum plate 616 was converted downward by a nip roller 624, the aluminum plate 616 was conveyed toward an electrolytic treatment vessel 614 in which the electrolyte 626 was stored, and then the conveyance direction thereof was converted into the horizontal direction by a roller 628. Next, when the aluminum plate 616 was negatively (−) charged by an electrolytic electrode 630, an anodizing film was formed on the surface thereof and the aluminum plate 616 taken out of the electrolytic treatment vessel 614 was conveyed to the subsequent step. In the anodizing treatment device 610, direction conversion means was formed of the roller 622, the nip roller 624, and the roller 628, and the aluminum plate 616 was conveyed to a mountain type and an inverted U type by the above-described rollers 622, 624, and 628 in a portion between the power supply vessel 612 and the electrolytic treatment vessel 614. The power supply electrode 620 and the electrolytic electrode 630 were connected to a DC power supply 634.

(k) Second Anodizing Treatment

A second step of an anodizing treatment was performed with an anodizing device using DC electrolysis having a structure illustrated in FIG. 5. An anodized film having a predetermined film thickness was formed by performing an anodizing treatment under conditions listed in Table C. An aqueous solution containing components listed in Table C was used as the electrolyte.

TABLE C

Second anodizing treatment

| Liquid type | Liquid component | Component concentration (g/L) | Temperature (° C.) | Current density (A/dm$^2$) | Time (s) | Film thickness (nm) |
|---|---|---|---|---|---|---|
| Sulfuric acid | H$_2$SO$_4$/Al | 170/5 | 54 | 15 | 13 | 900 |

(l) Third Anodizing Treatment

A third step of an anodizing treatment was performed with an anodizing device using DC electrolysis having a structure illustrated in FIG. 5. An anodized film having a predetermined film thickness was formed by performing an anodizing treatment under conditions listed in Table D. An aqueous solution containing components listed in Table D was used as the electrolyte.

TABLE D

Third anodizing treatment

| Liquid type | Liquid component | Component concentration (g/L) | Temperature (° C.) | Current density (A/dm$^2$) | Time (s) | Film thickness (nm) |
|---|---|---|---|---|---|---|
| Sulfuric acid | H$_2$SO$_4$/Al | 170/5 | 54 | 50 | 0.4 | 100 |

(m) Hydrophilization Treatment

In order to ensure hydrophilicity of a non-image portion, the non-image portion was subjected to a silicate treatment by being dipped using 0.2.5% by mass of a No. 3 sodium silicate aqueous solution at 50° C. for 7 seconds. The adhesion amount of Si was 8.5 mg/m$^2$. Thereafter, the resultant was washed with water using a spray.

The average diameter (average diameter of surface layer) of a large-diameter hole portion on the surface of the anodized film having micropores obtained in the above-described manner, the average diameter (average diameter of bottom portion) of the large-diameter hole portion in a communication position, the average diameter (diameter of small-diameter hole portion) of a small-diameter hole portion in the communication position, the average depth of the large-diameter hole portion and the small-diameter hole portion, the thickness (thickness of barrier layer) of the anodized film from the bottom portion of the small-diameter hole portion to the surface of the aluminum plate, and the density of the small-diameter hole portion are listed in Table E. The small-diameter hole portion includes a first small-diameter hold portion and a second small-diameter hole portion with depths different from each other and a small-diameter hole portion which is deeper than the other is referred to as the first small-diameter hole portion.

TABLE E (part 1)

| | | | Micropore | | |
| | | | Large-diameter hole portion | | |
| Average diameter of surface layer (nm) | Average diameter of bottom portion (nm) | Average depth (nm) | Average depth/average diameter of surface layer | Average depth/average diameter of bottom portion | Shape |
| --- | --- | --- | --- | --- | --- |
| 12 | 25 | 98 | 8.2 | 3.9 | Inverted taper |

(part 2)

| | | | Micropore | | | | |
| | Small-diameter hole portion | | | | | | Ratio (average diameter of surface layer/ diameter of small-diameter hole portion) |
| Average diameter (nm) | Average depth (nm) | Density of communication portion (portions/μm$^2$) | Average thickness of barrier layer (nm) | Minimum thickness of barrier layer (nm) | Density of micropores (pores/μm$^2$) | Increase magnification of surface area | |
| --- | --- | --- | --- | --- | --- | --- | --- |
| 9.8 | 888, 968 | 800 (650) | 17 | 16 | 500 | 4.0 | 1.22 |

In Table E, the average value and the minimum value are shown as the barrier layer thickness. The average value is obtained by measuring 50 thicknesses of the anodized film from the bottom portion of the first small-diameter hole portion to the surface of the aluminum plate and arithmetically averaging the values.

The average diameter of micropores (average diameter of the large-diameter hole portion and the small-diameter hole portion) is a value obtained by observing 4 sheets (N=4) of the surfaces of the large-diameter hole portion and the surfaces of the small-diameter hole portion using FE-SEM at a magnification of 150,000, measuring the diameters of micropores (the large-diameter hole portion and the small-diameter hole portion) present in a range of 400×600 nm$^2$ in the obtained four sheets of images, and averaging the values. Further, in a case where the depth of the large-diameter hole portion is deep and the diameter of the small-diameter hole portion is unlikely to be measured, the upper portion of the anodized film is cut and then various kinds of diameters are acquired.

The average depth of the large-diameter hole portion is a value obtained by measuring the cross section of the support (anodized film) using FE-TEM at a magnification of 500,000, measuring 60 cases (N=60) of distances from the surface of an arbitrary micropore to the communication position in the obtained image, and averaging the values. Further, the average depth of the small-diameter hole portion is a value obtained by observing the cross section of the support (anodized film) using FE-SEM (at a magnification of 50,000), measuring 25 cases of depths of arbitrary micropores in the obtained image, and averaging the values.

The "density of the communication portion" indicates the density of the small-diameter hole portion of the cross section of the anodized film in the communication position. The "increase magnification of the surface area" indicates the value calculated based on the following Equation (A).

$$\text{Increase magnification of surface area} = 1 + \text{pore density} \times ((\pi \times (\text{average diameter of surface layer}/2 + \text{average diameter of bottom portion}/2) \times ((\text{average diameter of bottom portion}/2 - \text{average diameter of surface layer}/2)^2 + \text{depth } A^2)^{1/2} + \pi \times (\text{average diameter of bottom portion}/2)^2 - \pi \times (\text{average diameter of surface layer}/2)^2))$$

Equation (A)

In the column of the "average depth (nm)" of the small-diameter hole portion, the average depth of the second small-diameter hole portion is shown on the left side and the average depth of the first small-diameter hole portion is shown on the right side. In the column of the "density of communication portion" of the small-diameter hole portion in Table E, the density of the first small-diameter hole portion is shown in the parentheses together with the density of the communication portion of the small-diameter hole portion.

In addition, the average diameter of the first small-diameter hole portion positioning from the bottom portion of the second small-diameter hole portion to the bottom portion of the first small-diameter hole portion was approximately 12 nm.

<Formation of Undercoat Layer>

The support was coated with an undercoat layer coating solution (1) with the following composition such that the drying coating amount was set to 20 mg/m$^2$, thereby forming an undercoat layer.

| (Undercoat layer coating solution (1)) | |
| --- | --- |
| Compound (1) for undercoat layer (the following structure) | 0.18 g |
| Hydroxyethyl imino diacetic acid | 0.05 g |
| Surfactant (EMALEX 710, manufactured by Nihon Emulsion Co., Ltd.) | 0.03 g |
| Preservative (BIOHOPE, manufactured by K•I CHEMICAL INDUSTRY CO., LTD.) | 0.01 g |
| Water | 28.0 g |

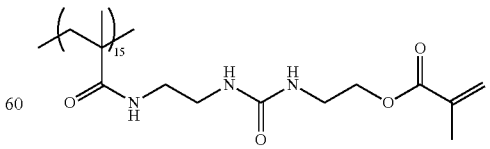

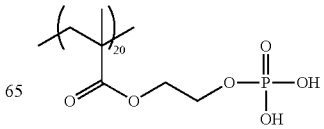

(Undercoat layer coating solution (1))

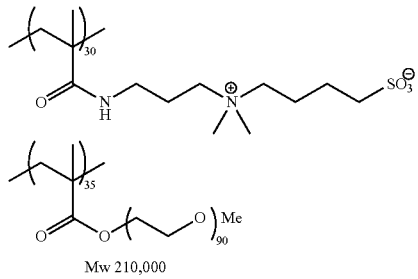

Mw 210,000
Compound (1) for undercoat layer

<Formation of Image Recording Layer>

The undercoat layer was bar-coated with an image recording layer coating solution (1) with the following composition and dried in an oven at 100° for 60 seconds, thereby forming an image recording layer having a drying coating amount of 1.0 g/m².

The image recording layer coating solution (1) was obtained by mixing a photosensitive solution (1) and a microgel solution (1) described below immediately before the coating and then stirring the solution.

| (Image recording layer coating solution (1)) | |
|---|---|
| (Photosensitive solution (1)) | |
| Binder polymer (1) (the following structure) (Mw: 55,000 and n: 2 (number of EO units)) | 0.240 g |
| Infrared absorbing agent (1) (the following structure) | 0.020 g |
| Borate compound (1) Sodium tetraphenyl borate | 0.010 g |
| Polymerization initiator (1) (the following structure) | 0.162 g |
| Polymerizable compound Tris (acryloyloxyethyl) isocyanurate (NK ESTER A-9300, manufactured by Shin-Nakamura Chemical Co., Ltd.) | 0.192 g |
| Anionic surfactant 1 (the following structure) | 0.050 g |
| Oil sensitizing agent Phosphonium compound (1) (the following structure) | 0.055 g |
| Oil sensitizing agent Benzyl dimethyl octyl ammonium · PF₆ salt | 0.018 g |
| Oil sensitizing agent Ammonium group-containing polymer (the following structure) (Mw: 50,000, reduction specific viscosity: 45 ml/g) | 0.040 g |
| Fluorine-based surfactant (1) (the following structure) | 0.008 g |
| 2-butanone | 1.091 g |
| 1-methoxy-2-propanol | 8.609 g |
| (Microgel solution (1)) | |
| Microgel (1) | 2.640 g |
| Distilled water | 2.425 g |

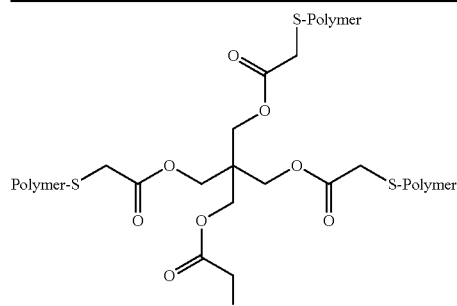

Polymer moiety described above

(Image recording layer coating solution (1))

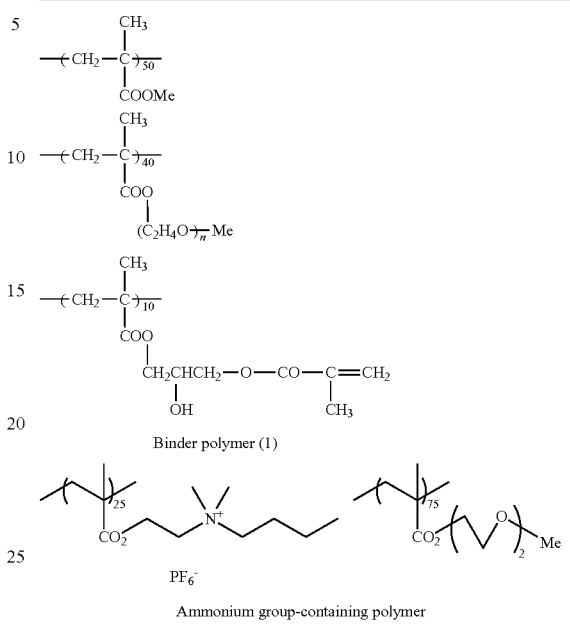

Binder polymer (1)

Ammonium group-containing polymer

Infrared absorbent (1)

Polymerization initiator (1)

Fluorine-based surfactant (1)

Phosphonium compound (1)

Anionic sufactant 1

(Preparation of Microgel (1))

As oil phase components, 10 g of an adduct (50% by mass of ethyl acetate solution, manufactured by Mitsui Chemical, Inc.) formed by adding 4.46 g of polyfunctional isocyante (75 mass % ethyl acetate solution, manufactured by Mitsui Chemical, Inc.) having the following structure, trimethylolpropane (6 mol), and xylene diisocyanate (18 mol), and adding methyl one-terminal polyoxyethylene (1 mol, repetition number of oxyethylene units: 90), 3.15 g of pentaerythritol triacrylate (SR444, manufactured by Nippon Kayaku Co., Ltd.), and 0.1 g of an anionic surfactant (PIONINE A-41C, manufactured by TAKEMOTO OIL & FAT Co., Ltd.) were dissolved in 17 g of ethyl acetate. As water phase components, 40 g of a 4 mass % aqueous solution of polyvinyl alcohol (PVA-205, manufactured by KURARAY CO., LTD.) was prepared. The oil phase components and the water phase components were mixed with each other and emulsified at 12,000 rpm for 10 minutes using a homogenizer. 25 g of distilled water was added to the obtained emulsion, and the resultant was stirred at room temperature for 30 minutes and stirred at 50° C. for 3 hours. The microgel solution obtained in this manner was diluted with distilled water such that the concentration of solid contents was set to 15% by mass, thereby preparing a microgel (1). The average particle diameter of the microgel measured by a light scattering method was 0.2 µm.

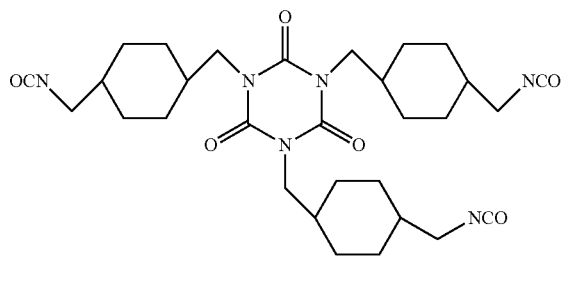

Polyfunctional isocyanate

<Formation of Protective Layer>

The image recording layer was bar-coated with a protective layer coating solution (1) with the following composition and dried in an oven at 120° for 60 seconds to form a protective layer having a drying coating amount of 0.15 g/m², thereby preparing a lithographic printing plate precursor 1.

| (Protective layer coating solution (1)) | |
|---|---|
| Inorganic layered compound dispersion liquid (1) (described below) | 1.5 g |
| Hydrophilic polymer (1) (the following structure, Mw: 30,000) (solid content) | 0.03 g |
| Polyvinyl alcohol (CKS50, manufactured by Nippon Synthetic Chemical Industry Co., Ltd., sulfonic acid-modified, saponification degree: 99% by mole or greater, degree of polymerization: 300) 6 mass % aqueous solution | 0.10 g |
| Polyvinyl alcohol (PVA-405, manufactured by KURARAY CO., LTD., saponification degree: 81.5% by mole, degree of polymerization: 500), 6 mass % aqueous solution | 0.03 g |
| Surfactant (EMALEX 710, manufactured by Nihon Emulsion Co., Ltd.) (the following structure) 1 mass % aqueous solution | 0.86 g |
| Ion exchange water | 6.0 g |

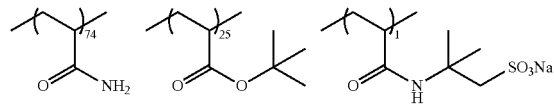

Hydrophilic polymer (1)

$C_{12}H_{25}$—$(OCHCH_2)_{10}$—OH
EMALEX 710

(Preparation of Inorganic Layered Compound Dispersion Liquid (1))

6.4 g of synthetic mica Somasif ME-100 (manufactured by CO-OP CHEMICAL CO., LTD.) was added to 193.6 g of ion exchange water and dispersed such that the volume average particle diameter (laser scattering method) was set to 3 µm using a homogenizer. The aspect ratio of the obtained dispersed particles was 100 or greater.

[Preparation of Lithographic Printing Plate Precursor 2]

<Formation of Image Recording Layer>

The undercoat layer of the support having the undercoat layer used for preparation of the lithographic printing plate precursor 1 was bar-coated with an image recording layer coating solution (2) with the following composition and dried in an oven at 70° for 60 seconds, thereby forming an image recording layer having a drying coating amount of 0.6 g/m².

| (Image recording layer coating solution (2)) | |
|---|---|
| Thermoplastic polymer fine particle aqueous dispersion liquid (described below) | 20.0 g |
| Infrared absorbing agent (2) (the following structure) | 0.2 g |
| Polymerization initiator IRGACURE 250 (manufactured by Ciba Specialty Chemicals, Inc.) | 0.4 g |
| Polymerization initiator (2) (the following structure) | 0.15 g |
| Polymerizable compound SR-399 (manufactured by Sartomer Japan Inc.) | 1.50 g |
| Mercapto-3-triazole | 0.2 g |
| Byk336 (manufactured by BYK Chemie GmbH) | 0.4 g |
| Klucel M (manufactured by Hercules, Inc.) | 4.8 g |
| ELVACITE 4026 (manufactured by Ineos Acrylics Ltd.) | 2.5 g |
| Anionic surfactant 1 (the above-described structure) | 0.15 g |
| n-propanol | 55.0 g |
| 2-butanone | 17.0 g |

The compounds described with the trade names in the composition above as follows.

IRGACURE 250: (4-methylphenyl)[4-(2-methylpropyl)phenyl]iodonium=hexafluorophosphate (75 mass % propylene carbonate solution)

SR-399: dipentaerythritolpentaacrylate

Byk336: modified dimethyl polysiloxane copolymer (25 mass % xylene/methoxy propyl acetate solution)

Klucel M: hydroxypropyl cellulose (2 mass % aqueous solution)

ELVACITE 4026: highly branched polymethyl methacrylate (10 mass % 2-butanone solution)

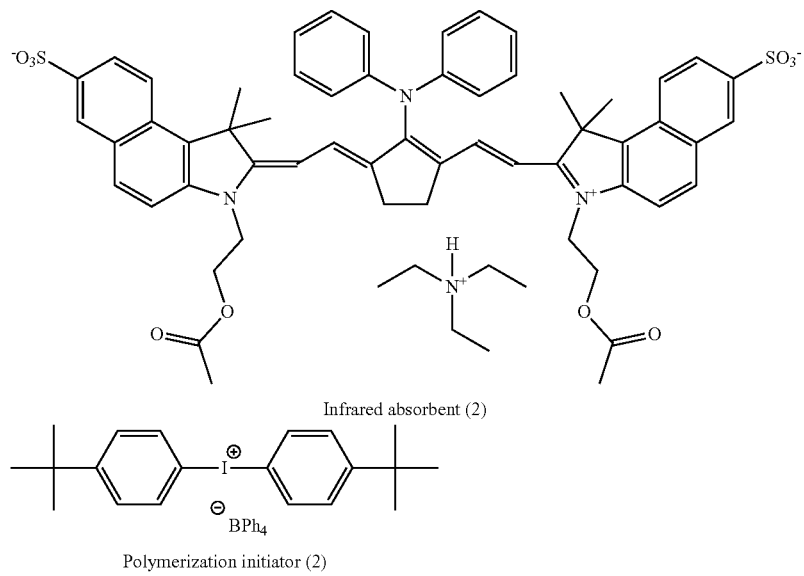

Infrared absorbent (2)

Polymerization initiator (2)

(Preparation of Thermoplastic Polymer Fine Particle Aqueous Dispersion Liquid)

Nitrogen gas was introduced into a 1,000 ml four-necked flask equipped with a stirrer, a thermometer, a dropping funnel, a nitrogen introduction pipe, and a reflex condenser, deoxygenation was performed, 10 g of polyethylene glycol methyl ether methacrylate (PEGMA, average number of repeating units of ethylene glycol: 20), 200 g of distilled water, and 200 g of n-propanol were added thereto, and then the mixture was heated until the internal temperature thereof was set to 70° C. Next, a mixture of 10 g of styrene (St), 80 g of acrylonitrile (AN), and 0.8 g of 2,2'-azobisisobutyronitrile prepared in advance was added dropwise for 1 hour. After dropwise addition was finished, the reaction was allowed to be continued for 5 hours, 0.4 g of 2,2'-azobisisobutyronitrile was added thereto, and the mixture was heated until the internal temperature was set to 80° C. Subsequently, 0.5 g of 2,2'-azobisisobutyronitrile was added for 6 hours. The total degree of polymerization at the stage of the continued reaction for 20 hours was 98% or greater, and a thermoplastic polymer fine particle aqueous dispersion liquid having PEGMA, St, and AN at a mass ratio of 10/10/80 was obtained. The particle size distribution of the thermoplastic polymer fine particle has a maximum value at 150 nm of the volume average particle diameter.

Here, the particle size distribution was acquired by imaging an electron micrograph of polymer fine particles, measuring the total number of 5,000 particle diameters of fine particles on the photograph, dividing the interval from the maximum value of the obtained measured value of the particle diameter to 0 into the logarithmic scale of 50, and plotting the appearance frequency of each particle diameter. Further, the particle diameter of a spherical particle having the same particle area as the particle area on the photograph was set to the particle diameter, as non-spherical particles.

[Preparation of Lithographic Printing Plate Precursor 3]

<Preparation of Support>

An aluminum plate having a thickness of 0.19 mm was immersed in a 40 g/L sodium hydroxide aqueous solution at 60° C. for 8 seconds so as to be degreased and then washed with demineralized water for 2 seconds. Next, the aluminum plate was subjected to an electrochemical roughening treatment in an aqueous solution containing 12 g/L of hydrochloric acid and 38 g/L of aluminum sulfate (18 hydrate) at a temperature of 33° C. and at a current density of 130 A/dm$^2$ using an AC for 15 seconds. Next, the aluminum plate was washed with demineralized water for 2 seconds, subjected to a desmutting treatment by being etched using 155 g/L of a sulfuric acid aqueous solution at 70° C. for 4 seconds, and washed with demineralized water at 25° C. for 2 seconds. The aluminum plate was subjected to an anodizing treatment in 155 g/L of a sulfuric acid aqueous solution for 13 seconds at a temperature of 45° C. and at a current density of 22 A/dm$^2$ and washed with demineralized water for 2 seconds. Further, the aluminum plate was treated at 40° C. for 10 seconds using 4 g/L of a polyvinyl phosphonic acid aqueous solution, washed with demineralized water at 20° C. for 2 seconds, and then dried, thereby preparing a support. The surface roughness Ra of the support was 0.21 m and the amount of the anodized film was 4 g/m$^2$.

<Formation of Image Recording Layer>

An image recording layer aqueous coating solution containing thermoplastic polymer fine particles, an infrared absorbing agent, and polyacrylic acid described below was prepared, the pH thereof was adjusted to 3.6, and a support was coated with the coating solution and dried at 50° C. for 1 minute to form an image recording layer, thereby preparing a lithographic printing plate precursor 3. The coating amount after the drying of each component is shown below.

Thermoplastic polymer fine particles: 0.7 g/m$^2$
Infrared absorbing agent IR-01: 1.20×10$^{-4}$ g/m$^2$
Polyacrylic acid: 0.09 g/m$^2$ The thermoplastic polymer fine particles, the infrared absorbing agent IR-01, the polyacrylic acid used for the image recording layer coating solution are as follows.

Thermoplastic polymer fine particles: styrene-acrylonitrile copolymer (molar ratio of 50:50), Tg: 99° C., volume average particle diameter: 60 nm Infrared absorbing agent IR-01: infrared absorbing agent having the following structure

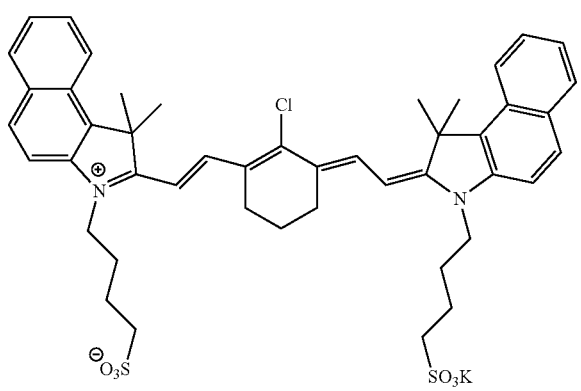

Polyacrylic acid, Mw: 250,000

[Specific Polymer]

Polymer P-1 (Amino Group-Containing Polyamide)

200 g of a 50% aqueous solution formed of aminoethyl-piperazine and adipic acid was reacted in an autoclave at 280° C. to 285° C. for 10 hours in a nitrogen atmosphere. The resulting solution was allowed to be naturally cooled to room temperature, thereby obtaining an amino group-containing polyamide aqueous solution having a concentration of 50% (weight average molecular weight: 30000).

Polymer P-2 (Sulfo Group-Containing Polyurethane)

19.5 g of the compound represented by the following Structural Formula 1, 20.3 g of isophorone diisocyanate (manufactured by Wako Pure Chemical Industries, Ltd.), 65.0 g of N,N-dimethylacetamide, and 5 drops of di-n-butyltin dilaurate were put into a 500 mL of three-neck round bottom flask equipped with a condenser and a stirrer, and the mixture was heated at 65° C. for 8 hours. Thereafter, the solution was diluted with 100 mL of methanol and 200 mL of N,N-dimethylacetamide. The reaction solution was poured into 4 L of ethyl acetate while stirring, and a white polymer was precipitated. This polymer was separated by filtration, washed with ethyl acetate, and dried in a vacuum, thereby obtaining sulfo group-containing polyurethane (weight average molecular weight: 95000).

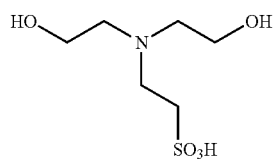

Structural Formula (1)

Polymer P-3 (Sulfo Group and Phosphoric Acid Group-Containing Polyurethane)

18.4 g of the compound represented by Structural Formula 1, 0.71 g of the compound represented by the following Structural Formula 2, 20.3 g of isophorone diisocyanate (manufactured by Wako Pure Chemical Industries, Ltd.), 65.0 g of N,N-dimethylacetamide, and 5 drops of di-n-butyltin dilaurate were put into a 500 mL of three-neck round bottom flask equipped with a condenser and a stirrer, and the mixture was heated at 65° C. for 8 hours. Thereafter, the solution was diluted with 100 mL of methanol and 200 mL of N,N-dimethylacetamide. The reaction solution was poured into 4 L of ethyl acetate while stirring, and a white polymer was precipitated. This polymer was separated by filtration, washed with ethyl acetate, and dried in a vacuum, thereby obtaining phosphoric acid group-containing polyurethane (weight average molecular weight: 50000).

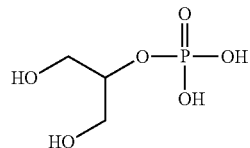

Structural Formula (2)

Polymer P-4 (Carboxy Group-Containing Polyurea)

Carboxy group-containing polyurea synthesized according to the description of Example 1 in JP1995-82333A (JP-H07-82333A) (weight average molecular weight: 50000).

Polymer P-5 (Sulfo Group-Containing Polyester)

Plus Coat Z-561 (manufactured by GOO CHEMICAL CO., LTD.).

Polymer P-6 (Carboxy Group-Containing Polycarbonate)

Carboxy group-containing polycarbonate described in Comparative Example 5 of WO2012/165569A Polymer P-7 (Polyamide)

N-methoxymethylated nylon (Torezine F-30K, manufactured by Nagase ChemteX Corporation)

<Preparation of Specific Polymer-Containing Coating Solution>

The components described in the following Table F were added to pure water and stirred, thereby preparing a polymer-containing coating solution. The polymer P-7 was prepared by adding the methanol solution (20%) to pure water. Further, the "coating solution a" to "coating solution b" are coating solutions for comparison and contain polyacrylic acid in place of the specific polymer.

| Specific polymer-containing coating solution | Specific polymer (% by mass) | Additive (% by mass) |
| --- | --- | --- |
| A | Polymer P-1 (1.5) | — |
| B | Polymer P-2 (1.5) | — |
| C | Polymer P-3 (1.5) | — |
| D | Polymer P-4 (1.5) | — |
| E | Polymer P-5 (1.5) | — |
| F | Polymer P-6 (1.5) | — |
| G | Polymer P-2 (1.5) | Sodium dihydrogen phosphate (0.1) |
| H | Polymer P4 (1.5) | Sodium dihydrogen phosphate (0.1) |
| I | Polymer P-5 (1.5) | Sodium dihydrogen phosphate (0.1) |
| J | Polymer P-7 (1.5) | |
| K | Polymer P-7 (1.5) | Sodium dihydrogen phosphate (0.1) |
| a | Polyacrylic acid [1] (1.5) | — |
| b | Polyacrylic acid [1] (1.5) | Sodium dihydrogen phosphate (0.1) |

[1] Weight average molecular weight: 25000

<Applying and Cutting of Specific Polymer-Containing Coating Solution>

After the specific polymer-containing coating solution was applied, cutting was performed according to the following method.

The specific polymer-containing coating solution was applied such that the solid content coating amount was set to a predetermined value by adjusting the conveying speed using 2NL04 (manufactured by HEISHIN Ltd.) as a coating device according to a dispenser method at a clearance of 0.3 mm and at a feed amount of 5 ml/min.

The fine particle-containing coating solution was applied to a region at a width of 10 mm from two sides of both end portions facing the lithographic printing plate precursor to positions respectively separated by a distance of 3 cm.

<Time of Applying Specific Polymer-Containing Coating Solution>

The time of applying the specific polymer-containing coating solution is as described in the following (1) to (5).

(1) A support was coated with the specific polymer-containing coating solution and then dried at 85° C. for 30 seconds.

(2) The support was coated with an undercoat layer, coated with the specific polymer-containing coating solution without drying, and then dried at 80° C. for 30 seconds.

(3) The support was coated with an undercoat layer, coated with the specific polymer-containing coating solution without drying, and then dried at 150° C. for 20 seconds.

(4) The support was coated with a protective layer (after the support was coated with an image recording layer in a case where the formation of a protective layer was not carried out), coated with the specific polymer-containing coating solution without drying, and then dried at 150° C. for 1 minute.

(5) The support was coated with a protective layer (after the support was coated with an image recording layer in a case where the formation of a protective layer was not carried out) and coated with the specific polymer-containing coating solution after the support was dried at 120° C. for 1 minute. Thereafter, the support was dried at 120° C. for 1 minute.

The lithographic printing plate precursor was coated with the specific polymer-containing coating solution by combining the specific polymer-containing coating solution, the lithographic printing plate precursor, and the time of coating the lithographic printing plate precursor with the coating solution as listed in Table G <Cutting>

The lithographic printing plate precursor was cut to have a shape of an end portion with a desired amount of shear drop and a desired width of shear drop by adjusting a gap between an upper cutting blade and a lower cutting blade, the amount of biting, and the blade tip angle using a rotary blade as illustrated in FIG. 2. The central position of a region coated with the specific polymer-containing coating solution was set to a cutting position under the above-described cutting conditions and two places of the lithographic printing plate precursor was cut. When the shear drop shape was measured by the following method, the amount of shear drop was 60 μm and the width of shear drop was 150 μm.

<Cutting and then Applying Specific Polymer-Containing Coating Solution>

After the lithographic printing plate precursor was cut, the specific polymer-containing coating solution was applied according to the following method.

<Cutting>

The lithographic printing plate precursor was continuously cut to have a shape of an end portion with a desired amount of shear drop and a desired width of shear drop by adjusting a gap between an upper cutting blade and a lower cutting blade, the amount of biting, and the blade tip angle using a rotary blade as illustrated in FIG. 2. When the shear drop shape was measured by the following method, the amount of shear drop was 60 μm and the width of shear drop was 150 μm.

The shear drop shape was measured using a surface roughness meter (SURFCOM, manufactured by TOKYO SEMITSU CO., LTD.). The model number 480A was used as the surface roughness meter and a stylus having a diameter of 2 μm was used. The shear drop shape was measured by moving the stylus toward an end portion of the lithographic printing plate precursor from the inside by a distance of approximately 1 mm at a speed of 3 mm/sec.

<Method of Applying Specific Polymer-Containing Coating Solution>

The method of applying the specific polymer-containing coating solution is as described in the following (1) to (4).

(1) Aero Jet (manufactured by Musashi Engineering Inc.) having a non-contact dispenser system was used as a coating device. The conveying speed was adjusted so as to have a desired coating amount under the conditions of a clearance of 6 mm and a discharge pressure of 0.05 MPa, the specific polymer-containing coating solution was applied to a region from the end portion of the lithographic printing plate precursor to a portion inside the end portion by 5 mm, and then the lithographic printing plate precursor was dried at 120° C. for 1 minute using a constant-temperature tank PH-201 (manufactured by ESPEC CORP.).

(2) Cloth containing the specific polymer-containing coating solution was brought into contact with the end portions of the lithographic printing plate precursor, the specific polymer-containing coating solution was applied to a region from the end portion of the lithographic printing plate precursor to a portion inside the end portion by 5 mm while the cloth was allowed to slide along the end portions, and then the lithographic printing plate precursor was dried at 120° C. for 1 minute using a constant-temperature tank PH-201 (manufactured by ESPEC CORP.).

(3) Cloth containing the specific polymer-containing coating solution was brought into contact with the end portions of the lithographic printing plate precursor, the specific polymer-containing coating solution was applied to a region from the end portion of the lithographic printing plate precursor to a portion inside the end portion by 5 mm by pressing the cloth from the top, and then the lithographic printing plate precursor was dried at 120° C. for 1 minute using a constant-temperature tank PH-201 (manufactured by ESPEC CORP.).

(4) A brush containing the specific polymer-containing coating solution was brought into contact with the end portions of the lithographic printing plate precursor, the specific polymer-containing coating solution was applied to a region from the end portion of the lithographic printing plate precursor to a portion inside the end portion by 5 mm, and then the lithographic printing plate precursor was dried at 120° C. for 1 minute using a constant-temperature tank PH-201 (manufactured by ESPEC CORP.).

The lithographic printing plate precursor was coated with the specific polymer-containing coating solution by combining the specific polymer-containing coating solution, the lithographic printing plate precursor, and the application of the specific polymer-containing coating solution as listed in Table G.

<Plate-Making of Lithographic Printing Plate Precursor>

The lithographic printing plate precursor prepared in the above-described manner was exposed in Luxel PLATESETTER T-6000III (manufactured by Fujifilm Corporation) equipped with an infrared semiconductor laser under conditions of external surface drum rotation speed of 1,000 rpm, a laser output of 70%, and a resolution of 2,400 dpi. The exposed image had a solid image and a 50% halftone dot chart.

[Evaluation of Lithographic Printing Plate Precursor]
<Evaluation of Performance of Preventing Edge Stain>

The lithographic printing plate precursor after image exposure was mounted on an offset rotary press (manufactured by Touhin Seiki K.K), and printing was performed on newsprint paper at a speed of 100,000 sheets/hour under standard water graduation conditions using SOIBI KKST-S (red) (manufactured by Dai Nippon Printing Co., Ltd.) as printing ink for newspaper and TOYO ALKY (manufactured by TOYO INK CO., LTD.) as dampening water. In the above-described printing step, 1,000-th printed matter was sampled, the degree of linear stain on an edge portion was visually observed, and then the evaluation was performed based on the following standard. The value of 5 to 3 is an acceptable level.

The results are listed in Table G.

5: Stain was not observed at all.
4: An intermediate level between 5 and 3.
3: A slight amount of stain was observed.
2: An intermediate level between 3 and 1.
1: Stain was clearly observed.

<Evaluation of Adhesion Between Interleaving Paper and Lithographic Printing Plate Precursor>

The prepared lithographic printing plate precursor and interleaving paper were humidity-controlled for 1 hour under the conditions of a temperature of 25° C. and a relative humidity of 50% RH. When a state in which one sheet of humidity-controlled interleaving paper was placed on one sheet of humidity-controlled lithographic printing plate precursor was set to one set, 50 sets were stored at 25° C. for 3 day in a state in which the sets were stacked on each other and 20 (kg/cm$^2$) of pressure was applied to the plate surface using a vise. Thereafter, the peeling properties of the interleaving paper in contact with the end portion region of the lithographic printing plate precursor were evaluated based on the following standard. The value of 5 to 3 is an acceptable level. The results are listed in Table G.

5: Adhesion between the interleaving paper and the end portion region of the lithographic printing plate precursor was not recognized at all and the interleaving paper was easily peeled off.
4: The interleaving paper was slightly adhered to the end portion region of the lithographic printing plate precursor, but the interleaving paper did not have transferred matter when peeled off.
3: The interleaving paper was slightly adhered to the end portion region of the lithographic printing plate precursor, and the interleaving paper had a slight amount of transferred matter when peeled off.
2: The interleaving paper was adhered to the end portion region of the lithographic printing plate precursor, and transferred matter in a shape of a, continuous line was found on the interleaving paper when the interleaving paper was peeled off.
1: The interleaving paper was adhered to the end portion region of the lithographic printing plate precursor, and transferred matter in a shape of a continuous line was clearly found on the interleaving paper when the interleaving paper was peeled off.

The interleaving paper was prepared by beating bleached kraft pulp and adding 0.4% by mass of a neutral size agent of alkyl ketene dimer (AKD) and 5.0% by mass of calcium carbonate to paper stock diluted to a concentration of 4% by mass. 3.0% by mass of a paper strengthening agent containing starch as a main component was applied to the paper stock so that paper-making was carried out, the resulting paper was nipped at a linear pressure of 18 kg/cm using a resin roll with a 2-nip soft calendar, and calendaring was performed, thereby preparing interleaving paper 1 having a basis weight 48 g/m$^2$ and a moisture content of 5.5% by mass.

In the following Table G, the "difference between contents of the specific polymer" indicates a difference between the content of the specific polymer per unit area in the end portion region of the lithographic printing plate precursor and the content of the specific polymer per unit area in a region other than the above-described region. In Comparative Examples 1 to 3, since the specific polymer was not applied to the end portion regions of the lithographic printing plate precursors, the "difference between contents of the specific polymer" were not measured. In Comparative Examples 5 to 12, the "difference between contents of the specific polymer" indicates a difference between contents of polyacrylic acid. The "time of coating" indicates the time of coating the positions corresponding to the end portion regions of the lithographic printing plate precursor with the specific polymer-containing coating solution during the step of forming configuration layers of the lithographic printing plate precursor. The "coating method" indicates the method of coating the end portion regions of the lithographic printing plate precursor with the specific polymer-containing coating solution after the lithographic printing plate precursor produced by performing the step of forming configuration layers of the lithographic printing plate precursor was cut.

TABLE G

| | Lithographic printing plate precursor | Specific polymer-containing coating solution | Difference between contents of specific polymer (mg/m$^2$) | Time of coating | Coating method | Edge stain | Adhesion to interleaving paper |
|---|---|---|---|---|---|---|---|
| | | | (part 1) | | | | |
| Example 1 | 1 | A | 505 | 2 | — | 4 | 5 |
| Example 2 | 1 | B | 503 | 2 | — | 4 | 5 |
| Example 3 | 1 | C | 502 | 2 | — | 4 | 5 |
| Example 4 | 1 | D | 507 | 2 | — | 4 | 5 |
| Example 5 | 1 | E | 504 | 2 | — | 4 | 5 |
| Example 6 | 1 | F | 502 | 2 | — | 4 | 5 |
| Example 7 | 1 | G | 510 | 2 | — | 5 | 5 |
| Example 8 | 1 | H | 513 | 2 | — | 5 | 4 |
| Example 9 | 1 | I | 513 | 2 | — | 5 | 4 |
| Example 10 | 1 | B | 895 | 2 | — | 5 | 4 |
| Example 11 | 1 | B | 100 | 2 | — | 4 | 5 |

TABLE G-continued

|  | Lithographic printing plate precursor | Specific polymer-containing coating solution | Difference between contents of specific polymer (mg/m²) | Time of coating | Coating method | Edge stain | Adhesion to interleaving paper |
|---|---|---|---|---|---|---|---|
| Example 12 | 1 | B | 53 | 2 | — | 4 | 5 |
| Example 13 | 1 | B | 12 | 2 | — | 3 | 5 |
| Example 14 | 1 | G | 910 | 2 | — | 5 | 4 |
| Example 15 | 1 | J | 511 | 2 | — | 3 | 5 |
| Example 16 | 1 | K | 508 | 2 | — | 3 | 5 |
| Example 17 | 2 | B | 500 | 2 | — | 4 | 5 |
| Example 18 | 2 | G | 503 | 2 | — | 5 | 4 |
| Example 19 | 3 | B | 505 | 1 | — | 4 | 5 |
| Example 20 | 3 | G | 508 | 1 | — | 5 | 4 |
| Example 21 | 1 | G | 447 | 1 | — | 5 | 4 |
| Example 22 | 1 | G | 512 | 3 | — | 5 | 4 |
| Example 23 | 1 | G | 1524 | 4 | — | 5 | 3 |
| Example 24 | 1 | G | 1533 | 5 | — | 5 | 3 |
| Example 25 | 1 | G | 520 | — | 1 | 5 | 4 |
| Example 26 | 1 | H | 511 | — | 1 | 5 | 4 |
| Example 27 | 1 | I | 513 | — | 1 | 5 | 4 |
| Example 28 | 1 | J | 522 | — | 1 | 5 | 3 |
| Example 29 | 1 | K | 508 | — | 1 | 5 | 3 |
| Example 30 | 1 | G | 3540 | — | 2 | 5 | 3 |
| Example 31 | 1 | G | 4130 | — | 3 | 5 | 3 |
| Example 32 | 1 | G | 4988 | — | 4 | 5 | 3 |
| (part 2) |  |  |  |  |  |  |  |
| Comparative Example 1 | 1 | — | — | — | 1 | 1 | 5 |
| Comparative Example 2 | 2 | — | — | — | 1 | 1 | 5 |
| Comparative Example 3 | 3 | — | — | — | 1 | 1 | 5 |
| Comparative Example 4 | 1 | G | 5 | 2 | — | 2 | 5 |
| Comparative Example 5 | 1 | a | 503 | 2 | — | 3 | 2 |
| Comparative Example 6 | 1 | b | 507 | 2 | — | 4 | 1 |
| Comparative Example 7 | 2 | a | 510 | 2 | — | 3 | 2 |
| Comparative Example 8 | 3 | a | 505 | 1 | — | 3 | 2 |
| Comparative Example 9 | 1 | b | 499 | — | 1 | 3 | 1 |
| Comparative Example 10 | 1 | b | 3560 | — | 2 | 4 | 1 |
| Comparative Example 11 | 1 | b | 4030 | — | 3 | 4 | 1 |
| Comparative Example 12 | 1 | b | 5023 | — | 4 | 4 | 1 |

From the results listed in the above-described Table G, in the lithographic printing plate precursor according to the present invention, specifically containing a large amount of the specific polymer, in the end portion regions, it was understood that edge stain does not occur, adhesion to interleaving paper is prevented even in a case where lithographic printing plate precursor and interleaving paper are stored in a stacked state, and the interleaving paper is satisfactorily peeled off from the lithographic printing plate precursor. Meanwhile, the lithographic printing plate precursors of the comparative examples in which the specific polymer is not applied to the end portion regions or the difference between contents is less than 10 mg/m² are insufficient in at least one of preventing occurrence of edge stain or preventing adhesion to interleaving paper. Further, in Comparative Examples 5 to 12, after 20 sheets of lithographic printing plate precursors were produced, contamination originated from the end portion treatment regions of the lithographic printing plate precursors were found at positioning pins used to adjust the positions of the lithographic printing plate precursors before the lithographic printing plate precursor were mounted on a drum of an exposure machine, but there was no contamination found in the lithographic printing plate precursor of the present invention.

INDUSTRIAL APPLICABILITY

According to the present invention, it is possible to provide a lithographic printing plate precursor for furnishing a lithographic printing plate in which adhesion to interleaving paper is prevented, contamination inside a device is prevented, and edge stain does not occur; a method of producing the same; and a printing method using the same.

The present invention has been described with reference to detailed and specific embodiments, but various changes or modifications can be made without departing from the spirit and the scope of the present invention and this is apparent to those skilled in the art.

The present application is based on Japanese Patent Application (JP2015-015962) filed on Jan. 29, 2015 and the contents of which are incorporated herein by reference.

EXPLANATION OF REFERENCES

1: lithographic printing plate precursor
1a: image recording layer surface
1b: support surface
1c: end surface
2: shear drop
X: amount of shear drop
Y: width of shear drop
B: boundary between image recording layer and support
10: cutting blade
10a: upper cutting blade
10b: upper cutting blade
11: rotary shaft
20: cutting blade
20a: lower cutting blade
20b: lower cutting blade
21: rotary shaft
30: lithographic printing plate precursor
41: aluminum plate
42, 44: roller-shaped brush
43: polishing slurry liquid
45, 46, 47, 48: support roller
50: main electrolytic cell
51: AC power supply
52: radial drum roller
53a, 53b: main pole
54: electrolyte supply port
55: electrolyte
56: slit
58: auxiliary anode
60: auxiliary anode vessel
W: aluminum plate
610: anodizing treatment device
612: power supply vessel
614: electrolytic treatment vessel
616: aluminum plate
618, 626: electrolyte
620: power supply electrode
622, 628: roller
624: nip roller
630: electrolytic electrode
632: vessel wall
634: DC power supply

What is claimed is:

1. A lithographic printing plate precursor comprising:
a support; and
an image recording layer on the support,
wherein a region of a surface of the lithographic printing plate precursor at a side of the image recording layer, which is from an end portion of the lithographic printing plate precursor to a portion inside the end portion by 5 mm, contains at least one polymer selected from: a polymer having an amide bond of the structure —NRC(=O)— in which R represents a hydrogen atom or a substituent in a main chain or a graft chain and derivatives of the polymer; a polymer having a urethane bond of the structure —NRC(=O)O— in which R represents a hydrogen atom or a substituent in a main chain or a graft chain and derivatives of the polymer; a polymer having a urea bond of the structure —NRC(=O)NR— in which R represents a hydrogen atom or a substituent in a main chain or a graft chain and derivatives of the polymer; a polymer having an ester bond of the structure —C(=O)O— in a main chain or a graft chain and derivatives of the polymer; and a polymer having a carbonate bond of the structure —OCOO— in a main chain or a graft chain and derivatives of the polymer, and has a content of the polymer per unit area which is greater than a content of the polymer per unit area in a region other than the region of a surface of the lithographic printing plate precursor at a side of the image recording layer by an amount of 10 mg/m$^2$ or greater, and
wherein the end portion of the lithographic printing plate precursor has a shear drop shape.

2. The lithographic printing plate precursor according to claim 1,
wherein the end portion of the lithographic printing plate precursor has a shear drop shape in which an amount of the shear drop is in a range of 35 to 150 μm.

3. The lithographic printing plate precursor according to claim 1,
wherein the polymer has a weight average molecular weight of from 2,000 to 1,000,000.

4. The lithographic printing plate precursor according to claim 1,
wherein the region of a surface of the lithographic printing plate precursor at a side of the image recording layer, which is from an end portion of the lithographic printing plate precursor to a portion inside the end portion by 5 mm, further contains a hydrophilic compound.

5. The lithographic printing plate precursor according to claim 4,
wherein the hydrophilic compound is a phosphoric acid compound or a phosphonic acid compound.

6. The lithographic printing plate precursor according to claim 1,
wherein the image recording layer contains a borate compound.

7. The lithographic printing plate precursor according to claim 1,
wherein the image recording layer contains a polymer compound in the form of fine particles.

8. The lithographic printing plate precursor according to claim 7,
wherein the polymer compound in the form of fine particles comprises a copolymer containing styrene and acrylonitrile.

9. The lithographic printing plate precursor according to claim 8,
wherein the polymer compound in the form of fine particles is a thermoplastic polymer.

10. A method of producing a lithographic printing plate precursor which includes a support; and an image recording layer on the support, in which a region of a surface of the lithographic printing plate precursor at a side of the image recording layer, which is from an end portion of the lithographic printing plate precursor to a portion inside the end portion by 5 mm, contains at least one polymer selected from: a polymer having an amide bond of the structure —NRC(=O)— in which R represents a hydrogen atom or a substituent in a main chain or a graft chain and derivatives of the polymer; a polymer having a urethane bond of the structure —NRC(=O)O— in which R represents a hydrogen atom or a substituent in a main chain or a graft chain and derivatives of the polymer; a polymer having a urea bond of the structure —NRC(=O)NR— in which R represents a hydrogen atom or a substituent in a main chain or a graft chain and derivatives of the polymer; a polymer having an ester bond of the structure —C(=O)O— in a main chain or a graft chain and derivatives of the polymer; and a polymer having a carbonate bond of the structure —OCOO— in a main chain or a graft chain and derivatives of the polymer, and has a content of the polymer per unit area which is greater than a content of the polymer per unit area in a region other than the region of a surface of the lithographic printing plate precursor at a side of the image recording layer by an amount of 10 mg/m$^2$ or greater, the method comprising:

cutting the lithographic printing plate precursor; and after the cutting, coating a part of the image recording layer with a coating solution containing the polymer.

\* \* \* \* \*